United States Patent [19]

Pearson

[11] Patent Number: 4,878,801

[45] Date of Patent: Nov. 7, 1989

[54] MACHINE FOR HANDLING CIRCUIT PACKAGE STORAGE TUBES

[75] Inventor: Rune S. Pearson, Torrance, Calif.

[73] Assignee: Invention Design Engineering Associates, Inc., Torrance, Calif.

[21] Appl. No.: 191,720

[22] Filed: May 2, 1988

Related U.S. Application Data

[63] Continuation of Ser. No. 864,723, May 19, 1986, abandoned.

[51] Int. Cl.$^4$ .............................................. B65B 69/00
[52] U.S. Cl. ...................................... 414/411; 221/210; 221/254; 414/403; 414/416
[58] Field of Search .................... 29/759, 771, 426.5, 29/762; 221/292, 210, 254; 414/403, 404, 411, 416, 304

[56] References Cited

U.S. PATENT DOCUMENTS

| | | | |
|---|---|---|---|
| 1,729,843 | 10/1929 | Reich | 29/759 X |
| 1,958,254 | 5/1934 | Van Der Poel | 221/210 |
| 2,589,600 | 3/1952 | Burkholder | 221/221 |
| 3,007,604 | 11/1961 | Lukawich | 221/210 X |
| 3,226,833 | 1/1966 | Lemelson | 33/143 |
| 3,662,881 | 5/1972 | Fineran | 414/404 X |
| 3,881,605 | 5/1975 | Grossman | 214/1 |
| 3,977,180 | 8/1976 | Booth | 59/16 |
| 4,042,122 | 8/1977 | Espy et al. | 214/1 |
| 4,163,183 | 7/1979 | Engelberger et al. | 318/568 |
| 4,194,865 | 3/1980 | Bandoh | 414/403 |
| 4,260,940 | 4/1981 | Engelberger et al. | 318/562 |
| 4,260,941 | 4/1981 | Engelberger et al. | 318/562 |
| 4,275,986 | 6/1981 | Engelberger et al. | 414/730 |
| 4,286,380 | 9/1981 | Bount | 29/741 |
| 4,305,130 | 12/1981 | Kelley et al. | 364/513 |
| 4,311,031 | 1/1982 | Schwarze | 72/133 |
| 4,345,866 | 8/1982 | Greene | 414/224 |
| 4,351,663 | 9/1982 | Wood | 65/66 |
| 4,402,053 | 8/1983 | Kelley et al. | 364/513 |
| 4,423,998 | 1/1984 | Inaba et al. | 414/730 |
| 4,439,917 | 4/1984 | Pearson | 29/825 |
| 4,567,652 | 2/1986 | Gussman et al. | 29/837 |
| 4,618,305 | 10/1986 | Cedrone et al. | . |
| 4,629,387 | 12/1986 | Stillman et al. | . |
| 4,647,269 | 3/1987 | Wedel et al. | . |
| 4,648,773 | 5/1987 | Bieganski | . |
| 4,660,710 | 4/1987 | Swapp et al. | . |
| 4,686,816 | 8/1987 | Keller | . |

FOREIGN PATENT DOCUMENTS

| | | | |
|---|---|---|---|
| 663682 | 5/1963 | Canada | 29/759 |
| 168999 | 1/1986 | European Pat. Off. | 29/759 |
| 479179 | 11/1975 | U.S.S.R. | 29/759 |
| 748932 | 7/1980 | U.S.S.R. | 29/759 |

*Primary Examiner*—Joseph M. Gorski
*Attorney, Agent, or Firm*—Christie, Parker & Hale

[57] ABSTRACT

A fully automated machine is capable of selecting a single "A"-frame storage tube for dual in-line integrated circuit packages from a number of such tubes in a bulk storage bin and then rotating that tube about its longitudinal axis so that the dual in-line packages can be fed into or out of the storage tube in either the live bug (leads down) or dead bug (leads up) positions. The machine will also remove and then replace the stop pin at one end of the storage tube.

12 Claims, 21 Drawing Sheets

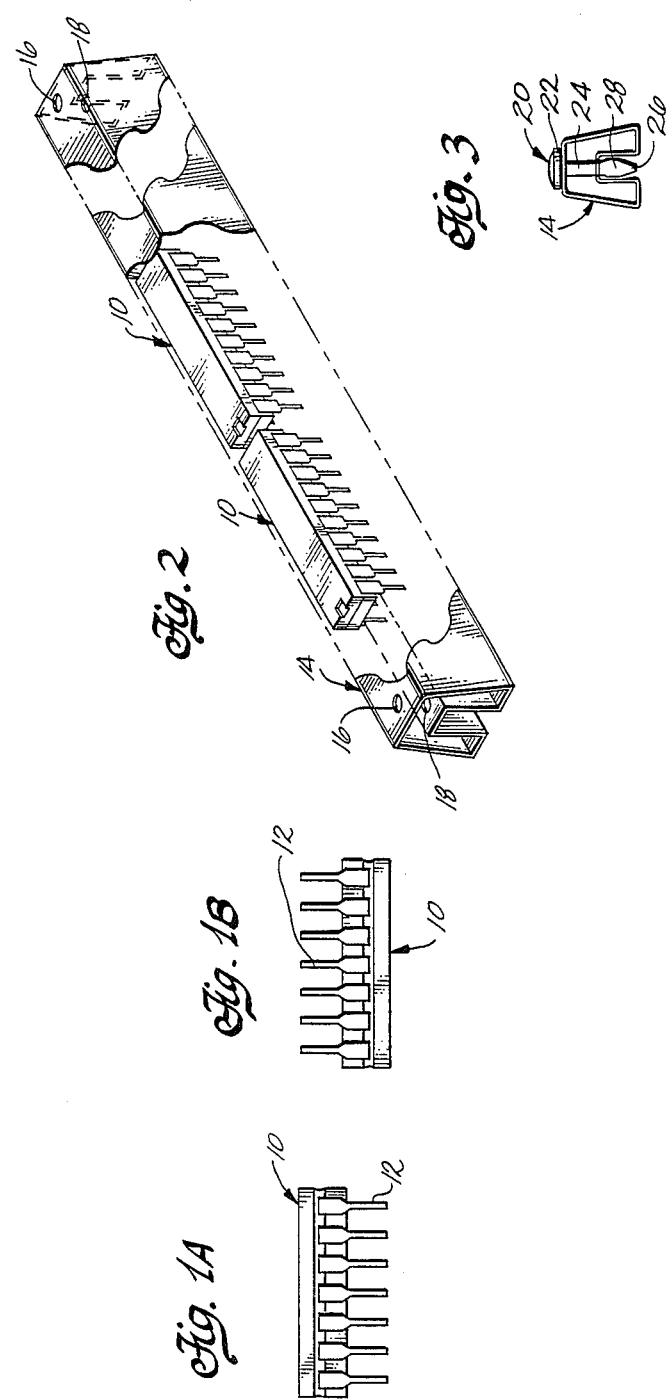

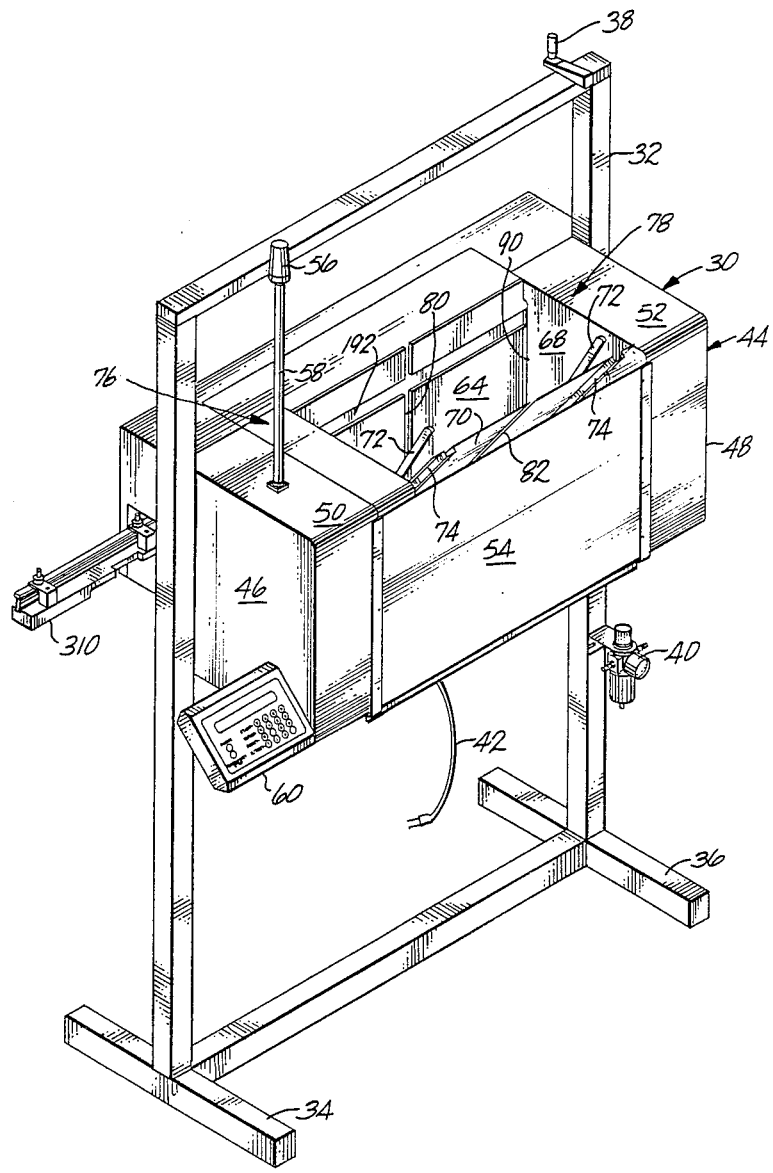

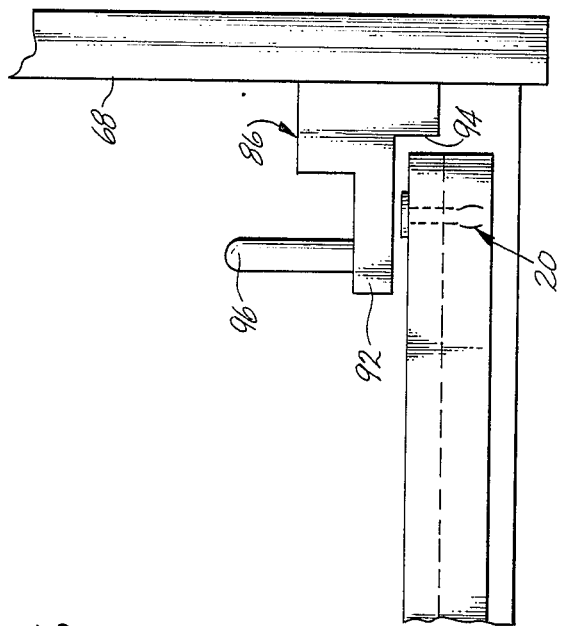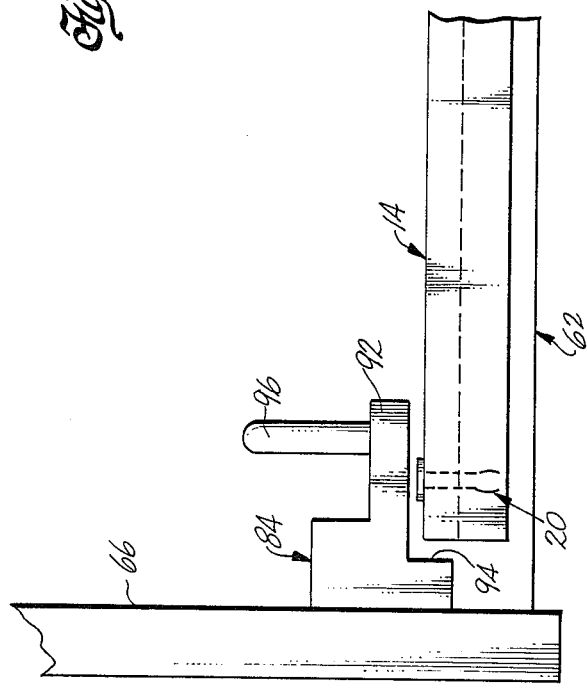

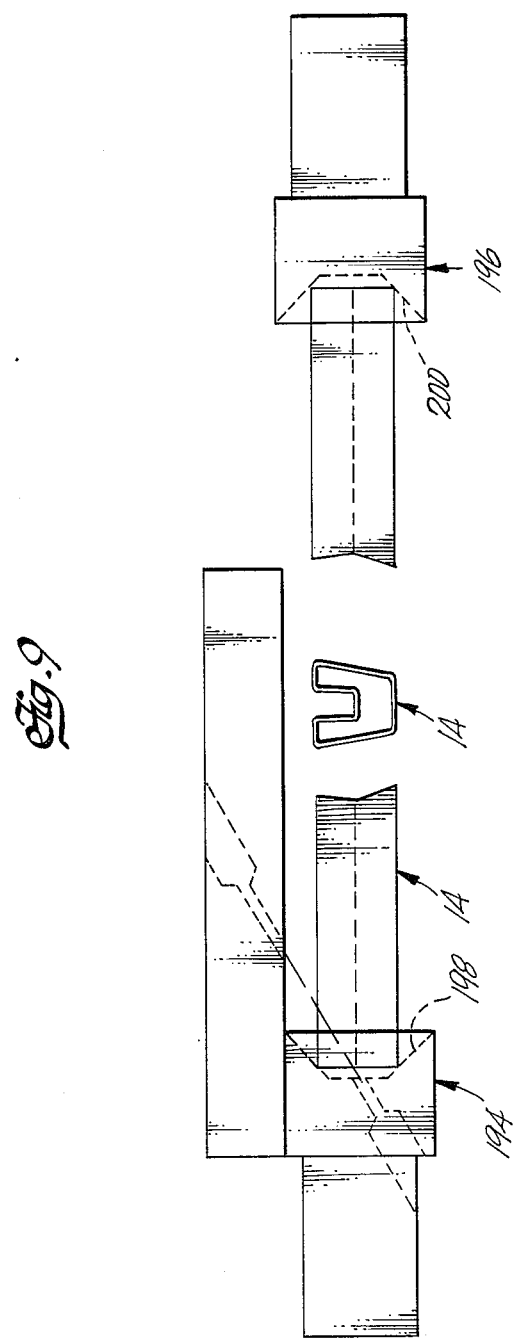

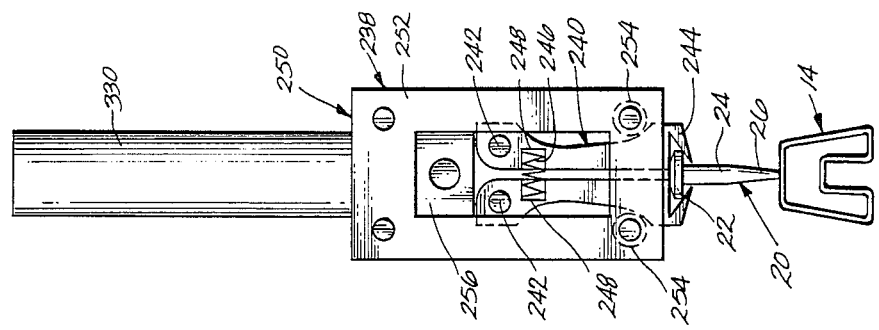
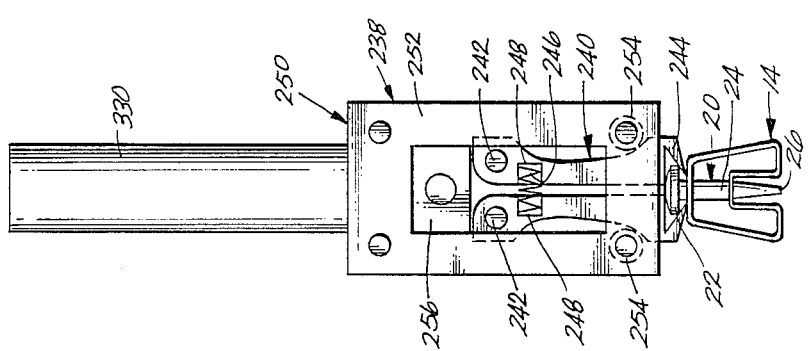
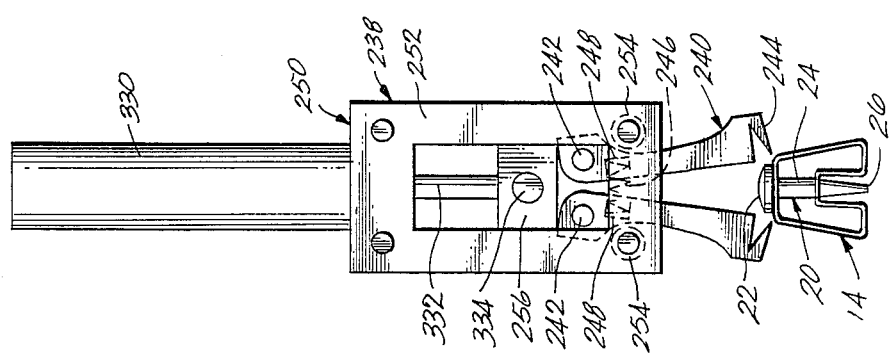

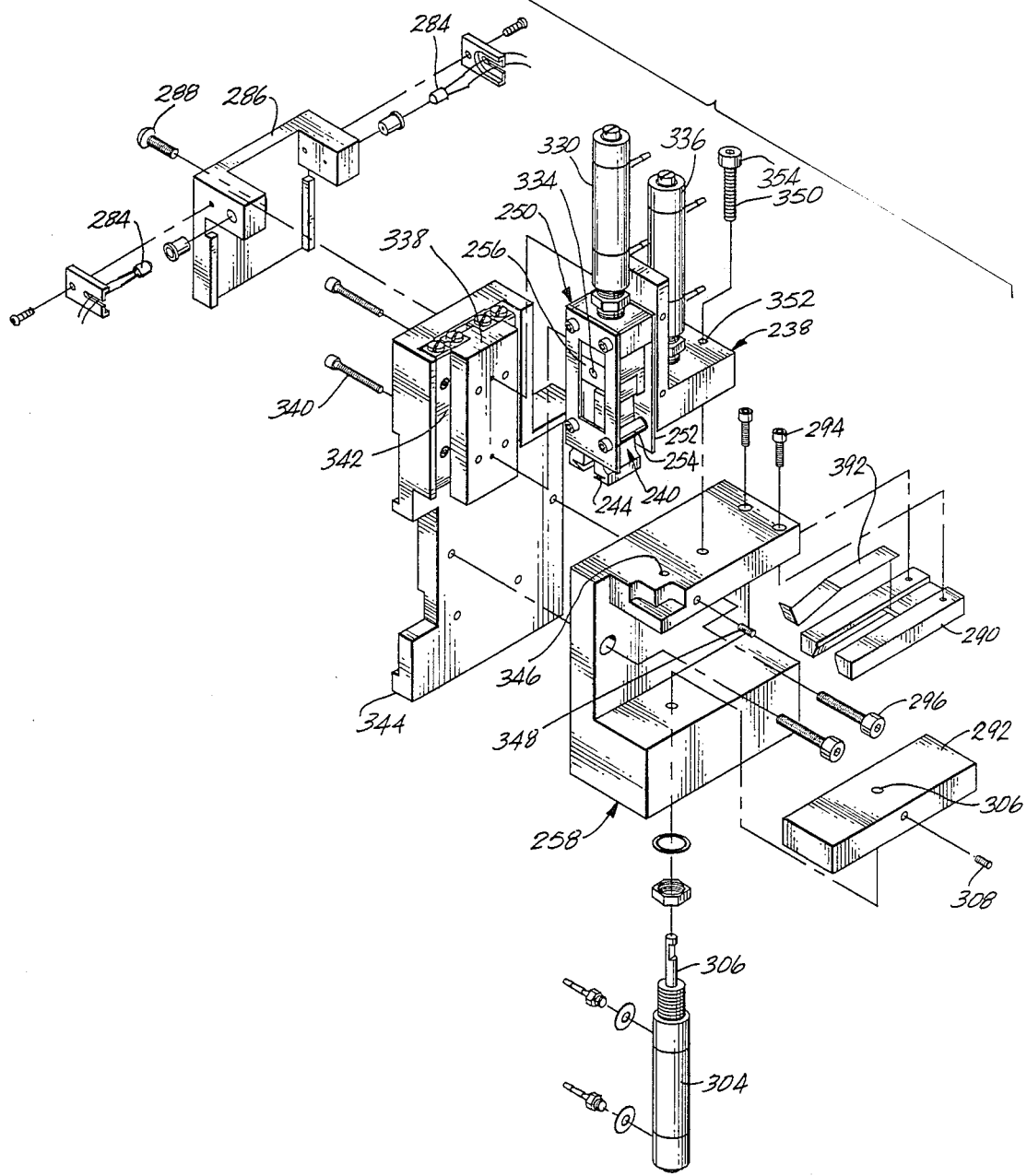

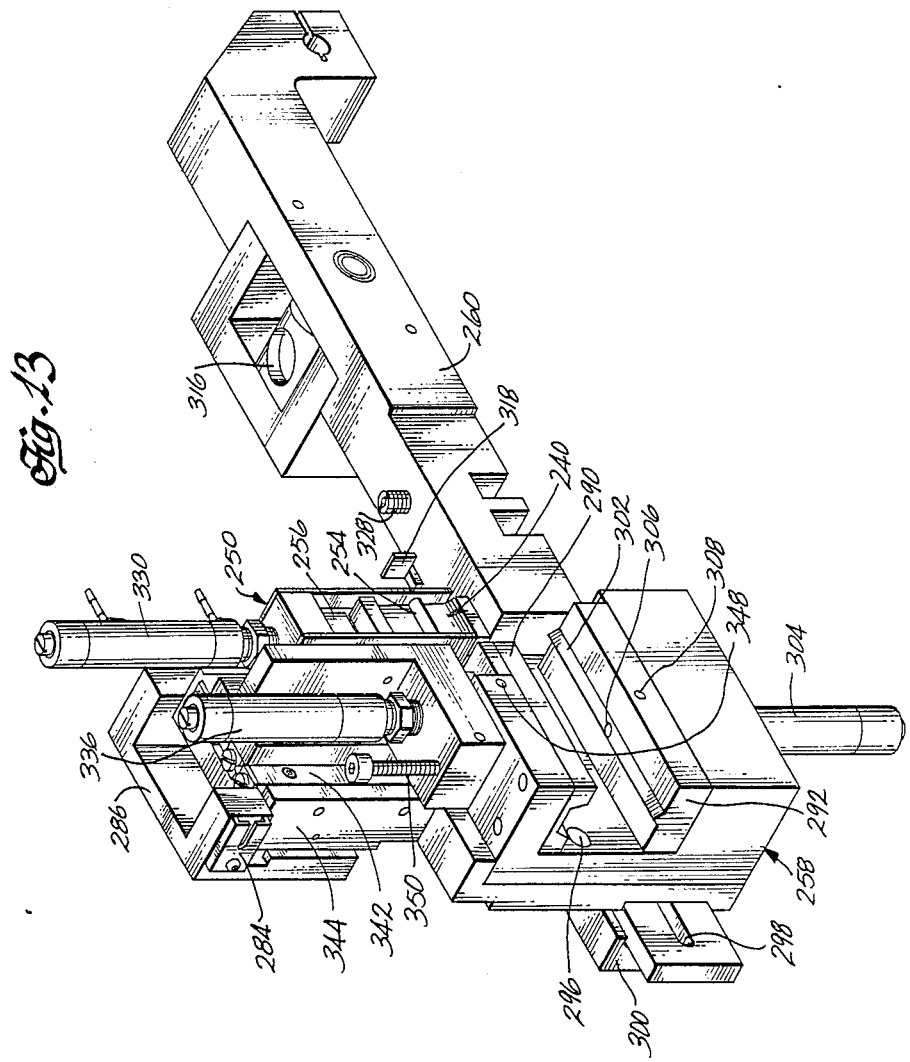

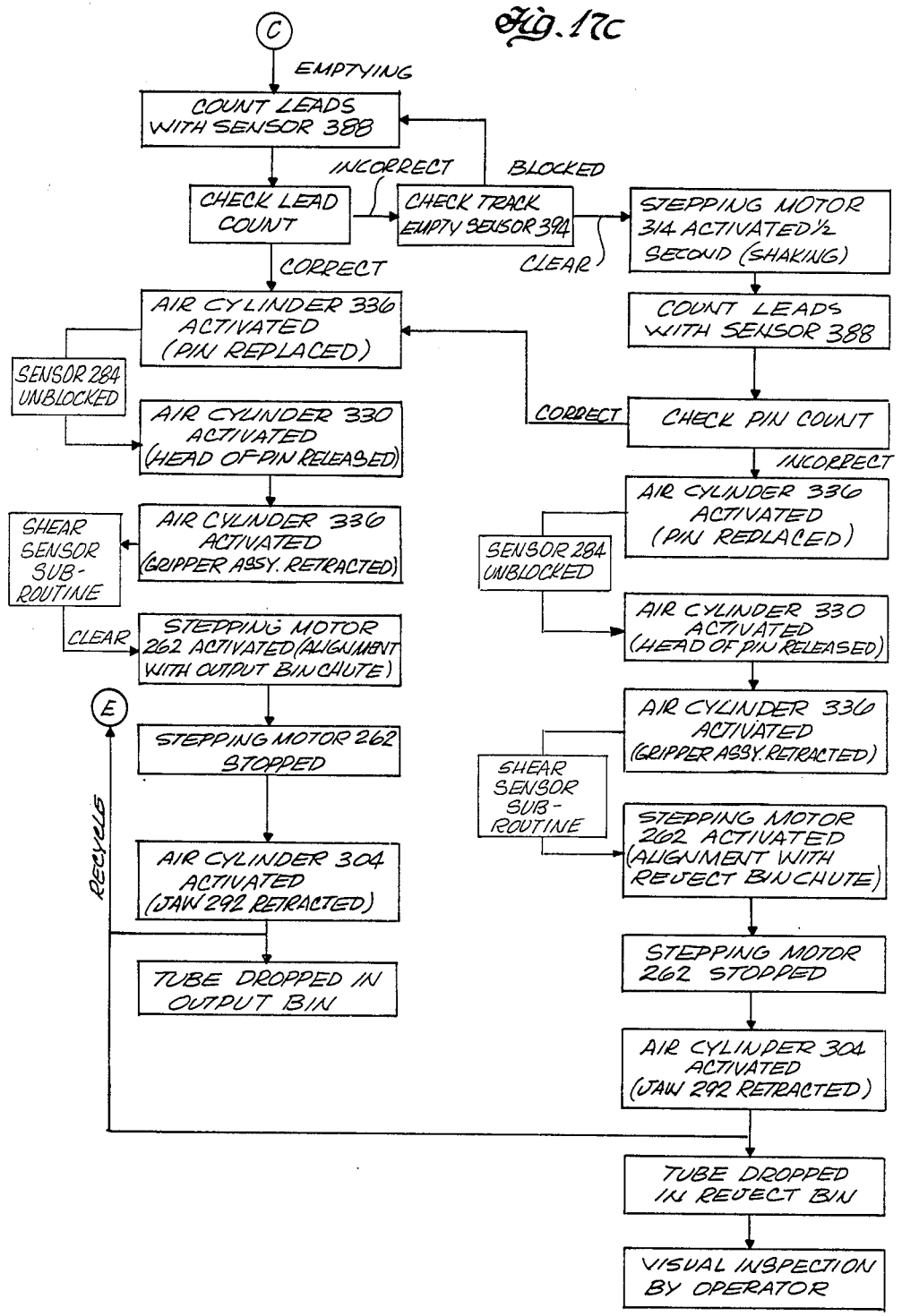

MACHINE FOR HANDLING CIRCUIT PACKAGE STORAGE TUBES

CROSS REFERENCE TO RELATED APPLICATION

This is a continuation of application Serial No. 06/864,723, filed May 19, 1986 and now abandoned.

FIELD OF THE INVENTION

The present invention is directed to a machine handling component storage tubes and, more particularly, to an from a bin containing many storage tubes, orienting the retrieved tube to a desired rotational position and feeding components to and from the retrieved tube.

BACKGROUND OF THE INVENTION

Integrated circuit packages are presently in wide use in the electronics industry in various types of electronic equipment. Integrated circuit packages can be characterized as high density devices having a very high number of electrical circuit packaged therein in a very small area for performing various electronic functions. The circuits that are arranged in an integrated circuit package are not visible, and all that is visible in an inspection of most such devices are the aligned, thin, external leads extending from the opposite sides of the package that allow it to be readily inserted into an integrated circuit socket. Some circuit packages are now available in a leadless configuration such as those described in U.S. Pat. Nos. 4,551,746 and 4,551,747.

During the manufacture of circuit packages or related electronic devices, the devices must be transferred to and from types of equipment for the performance of different manufacturing steps. Examples of typical manufacturing steps are: (1) preliminary testing; (2) burn in loading; (3) burn in unloading; (4) elevated temperature testing; (5) cold temperature testing; (6) date code and part number marking; (7) lead scanning inspection; (8) centrifuge testing; (9) lead forming; and (10) final inspection. A burn in unloading process and apparatus for performing that process are disclosed in U.S. Pat. No. 4,439,917.

The electronic devices are protected during handling between the various manufacturing steps or processes by being held in protective storage tubes. These tubes usually hold about 25 to 50 devices and are closed or pinned at both ends to keep the devices from falling out during handling. When processing is complete, the devices are shipped to customers in the tubes. Most tubes are made of extruded plastics, with some made of aluminum or stainless steel and used during in-house processing.

A large electronic device manufacturer will process up to a million or more devices per day. However, the devices are generally processed in lots averaging less than 3,000 devices in number. Assuming an average of 25 devices per tube, each lot will consist of around 120 tubes. One lot of tubes is normally stored in a bulk container called a "tote" box, which is transferred manually, along with related paperwork, between separate manufacturing processes.

Before performing a process step, the operator must individually pick up each tube from the tote box, remove the closure or stop pin from one end of each, tube and feed the devices into the process equipment. Upon completion of the process step, the operator must replace the closures or stop pins in each tube and return each tube to the tote box. Removal and replacement of the closures or stop pins is very time consuming. Therefore, many manufacturers attempt to transfer tubes between process steps with the closures or stop removed from one end. However, this leads to extensive damage of devices if tubes are dropped or accidentally turned wrong end up. When devices land on the floor, the package can be chipped or cracked or the leads broken or bent. In addition, when the operator must manually pick up devices from the floor, they can be damaged by electro-static discharge.

During any given process step, an operator must be present to load devices from and off load devices into tubes. This labor cost is a major part of the cost of manufacturing the devices. The operator can also cause damage to devices during handling by electro-static discharge or by accidentally dropping devices on the floor. Certain types of process equipment are able to operate on devices at speeds exceeding the rate at which an operator can manually feed devices to the equipment. Thus, either two or more operators are needed or the full speed capability of the process equipment cannot be utilized.

In summary, the current system of manually loading and off loading electronic devices to and from various manufacturing processes has some major disadvantages: (1) the labor cost is excessive; (2) the throughput is low; (3) the manual handling results in excessive damage to devices; (4) the equipment can be run only when an operator is present and must be stopped when the operator leaves; and (5) the high speed capacity of equipment is not fully utilized. A number of attempts have been made to automate or semi-automate tube handling to overcome these disadvantages. However, a number of problems must be addressed in automating tube handling.

An irregularly shaped tube must be selected from a bulk tote box holding many tubes. Not only do tube dimensions vary for tubes from different tube manufacturers, but they vary for tubes from the same supplier due to the inherent dimensional instability of the plastic extrusion process used to manufacture tubes. Once the tube is selected, it must be automatically oriented and rotated so that the devices are fed into or out of the tube with an orientation acceptable to the process equipment. When tubes are in bulk storage, their orientation and, in particular, their rotational position is random. The closure or stop pin must be removed from and replaced in one end of the selected tube. Most stop pins are plastic and are dimensionally predictable when made from the same injection mold. However, different pin suppliers make greatly different pin types so a pin pulling and insertion system must be able to handle various types of pins in a consistent manner. An automatic tube handling system should also be able to handle unexpected events without requiring operator assistance. Events such as: damaged or deformed tube ends; warped or twisted tubes; mixed batches of tubes from different suppliers; and devices that do not flow into or out of a tube.

Past attempts to automate tube handling involve semi-automatic means for loading and/or unloading devices where an operator still has to perform one or more vital functions. For example, some semi-automatic handling systems require the operator to select one tube from bulk storage, orient the tube, pull out the stop pin and place the tube in a chute or on a belt. All the semi-automatic handling systems require the operator to make most of the major decisions involved. These systems are not cost efficient and have not been generally accepted in the industry.

Past efforts at automating the selection of one tube from bulk storage have used "V"-shaped hoppers with various means for allowing the release of one tube at a time from the bottom of the hopper. These methods suffer from frequent jams caused by the irregular shape of the tubes and the tubes being compacted by the weight of the tubes in the hopper.

A number of approaches have been taken to tube orientation. Supporting a tube on air jets will cause it to orient in a particular position based on its center of gravity. Agitation of a tube until it fits into a mechanical reference to match a particular tube side will orient a tube in a particular position. Combinations of break beam sensors measuring two or more tube dimensions while the tube is being rotated will allow rotation to a particular position. All of these orientation methods are feasible to some extent when adjusted for a tube type having uniform dimensions. However, difficulties arise when tubes of varying dimensions are to be handled.

Stop pin removal is one area of tube handling where previous efforts have been limited to manually operated tools. A wedge type tool has been developed that works in a similar manner to the claw of a hammer. The stop pin is pulled out as the wedge is moved along the tube in a direction perpendicular to the length of the stop pin. However, this pin removal method is unsatisfactory because the side force on the pin can cause deformation of the tube around the hole in the tube that received the pin. This deformation can in turn impede the flow of devices into or out of the tube.

In addition, components, such as sockets, connectors, resistors, relays and switches, are increasingly being stored in tubes for protection during handling and shipping. Manipulation of these tubes between manufacturing steps or processes is likely to pose many of the same problems encountered with manipulation of circuit package storage tubes.

Accordingly, a need exists for a fully automated machine capable of selecting a single tube from bulk storage, orienting the selected tube to a particular position and removing the closure or stop pin at one end of the tube so that components can be fed into or out of the tube. The machine should be able to handle most unexpected problems without operator assistance and should be adaptable to interface with any number of different types of component processing equipment.

SUMMARY OF THE INVENTION

In accordance with the present invention, a machine for handling elongated storage tubes capable of holding components in a uniform and substantially fixed position with respect to at least one rotational axis of the components within individual tubes is provided. The machine is comprised of a bin for holding the tubes in a substantially known longitudinal position, the bin includes means for moving tubes to a substantially known lateral position, and automated means for grasping an individual tube in the bin, and rotating the tube about its longitudinal axis to a desired rotational position determined by reference to an indexing means on the tube related to the position of components held in the tube, whereby components with a substantially known orientation can be fed to and from the tube.

In a preferred embodiment, wherein each storage tube includes a removable closure for holding components longitudinally within the tube, the machine is also comprised of means for releasing the closure, whereby components can be fed longitudinally to and from the tube. Preferably, the closure releasing means is arranged to maintain the released closure in a substantially known relationship to the tube during feeding of the components and to replace the closure after feeding of the components.

Methods for automatically and selectively retrieving single elongated members from a storage area capable of holding a number of such members, for automatically rotationally. orienting an elongated member having an indexing means thereon, and for automatically pulling a stop pin from a component storage tube are also encompassed by the present invention. The retrieving method is comprised of the steps of: holding the members in a substantially known longitudinal position; urging the members toward a substantially known lateral position; moving opposed gripping means along said lateral position just beyond the ends of the members in said longitudinal position said gripping means are opposite the ends of a single member; moving the gripping means toward the ends of the single member to grip that member; and moving the opposed gripping means and the single member along said lateral position. The orienting method is comprised of the steps of: rotating the member about its longitudinal axis; positioning a break beam sensor at one end of the elongated member such that the beam is directed at an angle to the longitudinal axis of the member across the volume swept out by the rotating member; detecting the indexing means on the elongated member with the break beam sensor while the member is rotating; determining a reference rotational orientation relative to the indexing means; and rotating the member to the desired rotational orientation. The stop pin pulling method is comprised of the steps of: positioning a pair of opposed jaws on opposite sides of the head of the stop pin; moving the jaws toward one another to slide under the head of the stop pin at approximately the same time; and moving the jaws with the stop pin away from the stop pin at substantially a right angle to the tube surface.

BRIEF DESCRIPTION OF THE DRAWINGS

FIG. 1A is a side view of a dual in-line packaged integrated circuit in the live bug (leads down) position;

FIG. 1B is a side view of the integrated circuit package of FIG. 1A in the dead bug (leads up) position;

FIG. 2 is a pictorial view of an "A"-frame storage tube partially broken away to reveal the integrated circuit packages like that of FIG. 1A stored therein;

FIG. 3 is an end view of the storage tube of FIG. 2 with a stop pin in place to prevent the integrated circuit packages from sliding out of the end of the tube;

FIG. 4 is a pictorial view of an automatic tube handling machine according to the present invention;

FIG. 6 is a schematic front view of a pair of gripping fingers for selecting a tube from the hopper that is part of the machine of FIG. 4;

FIG. 9 is a schematic top view of a means for rotating a selected tube is part of the machine of FIG. 4;

FIG. 11A is a schematic side view of a stop pin pulling means that is part of the machine of FIG. 4 in position to grip the top of the stop pin;

FIG. 11B is a schematic side view of the stop pin pulling means of FIG. 11A after it has gripped the top of the stop pin;

FIG. 11C is a schematic side view of the stop pin pulling means of FIG. 11A after it has pulled the stop pin;

FIG. 12 is an exploded pictorial view of the stop pin pulling means of FIG. 11A and its operative mechanisms;

FIG. 13 is a detailed pictorial view of the stop pin pulling means of FIG. 11A and its operative mechanisms;

FIG. 17C is a continuation of the flow diagram of FIG. 17B: and

FIG. 17D is a continuation of the flow diagram of FIG. 17B.

DETAILED DESCRIPTION

Figure 5:
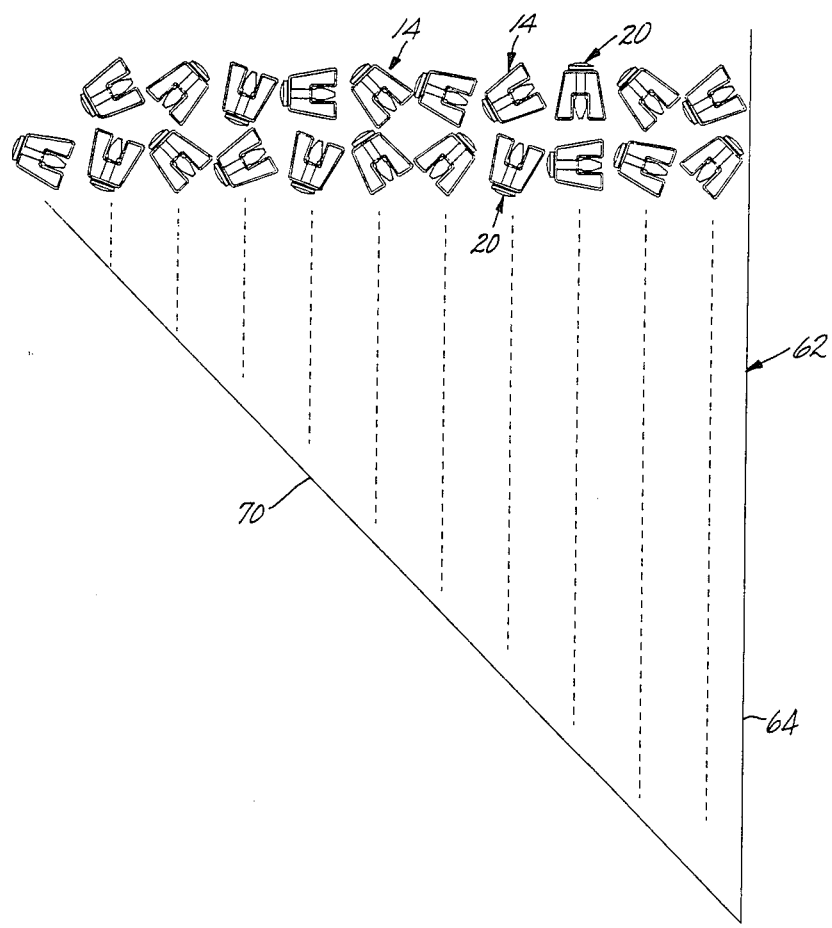
FIG. 5 is a schematic side view of a bulk storage hopper or bin for tubes that is part of the machine of FIG. 4.

The following description is directed to the automatic handling of tubes holding integrated circuits in a dual in-line package (DIP) configuration. In such a configuration, the circuit package has aligned, thin, external leads extending from its opposite sides. These circuit packages are commonly available in 0.300 inch, 0.400 inch or 0.600 inch sizes. The dimension is a reference to the distance between the opposing rows of leads on a device. DIPs are normally stored in "A"-frame tubes such that the leads extend out into the opposite legs of the "A"-frame. These tubes usually range from 20 to 24 inches in length and have plastic stop pins at each end to hold the devices longitudinally within the tubes. DIPs are generally fed into or out of processing equipment in either the live bug (leads down) or dead bug (leads up) positions.

The principles of the present invention are not limited to DIP devices. A machine according to the present invention could be used to advantage wherever automated handling of storage tubes for components is desirable. However, the description is directed to the automatic handling of storage tubes for DIP devices because it is currently the single most frequently used package configuration and the component most often stored in a tube.

With reference to FIG. 1A, a DIP integrated circuit 10 is shown in live bug position with leads 12 extending downward. In FIG. 1B, the DIP integrated circuit is shown in dead bug position with the leads extending upward. These two positions represent the most common orientations in which DIPs are fed to or from processing equipment and which an automatic tube handler must be able to distinguish between. FIG. 2 shows an "A"-frame storage tube 14, a hollow, elongated tube capable of receiving DIPs 10 therein. The tube has a "A"-shaped wall configuration so that the DIPs stored therein are held in a uniform and substantially fixed rotational position with respect to the tube. The leads on the DIPs extend out into the opposite legs of the "A"-frame and prevent the DIPs from rotating within the tube. Therefore, the external configuration of the storage tube reflects the rotational position of the DIPs stored inside.

Adjacent each end of storage tube 14, a hole 16 extends through roughly the center of the top wall of the tube. Opposite each hole 16, a hole 18 extends through roughly the center of the wall of the tube making up the cross member of the "A"-frame. The pair of holes are aligned with one another so that they can receive a stop pin 20 (FIG. 3). When in place, the stop pin extends across the open end of the tube orthogonal to the longitudinal axis of the tube to prevent DIPs from sliding out of the end of the tube.

Pin 20 has a flattened head 22 which rests on the outside surface of the top wall of the tube when the pin is in place. Head 22 has a diameter wider than the diameter of hole 16 so that the pin will not push through hole 16. Extending outward from the center of one flattened surface of head 22 is a shaft 24. Shaft 24 has a diameter and cross-sectional shape, in the depicted embodiment it has a circular cross section, that allow it to be received in holes 16 and 18. The shaft should also be long enough that it will extend across the end of the tube when head 22 is resting on the outside surface of the top wall of the tube. Otherwise, the pin will not be effective at holding the DIPs in the tube. Preferably, the shaft will be longer so that it extends through hole 18 when the pin is in place. However, the shaft should not be so long that it extends beyond the legs of the "A"-frame or it will increase the tendency of tubes to get tangled with one another.

It is also preferable, that shaft 24 taper down to a point 26 at the end remote from head 22. Point 26 should have a diameter smaller than the diameters of holes 16 and 18 so that it can facilitate the placement of the pin in the holes. Between the point where shaft 24 extends beyond hole 18 when the pin is in place and point 26, it is preferable to have a bulb 28 on the shaft. The bulb is a gradual enlargement of the diameter of the shaft to a diameter just larger than the diameter of the holes 16 and 18 before the shaft tapers to point 26. This bulb helps keep the pin in place during storage or transfer of the tubes.

FIG. 4 depicts an automatic tube handling machine 30 according to a preferred embodiment of the present invention. The machine is supported in a rectangular frame 32 with feet 34 and 36 at opposite corners of the bottom member of the frame. These feet preferably contain means (not shown) for leveling the machine at their opposite ends. The feet are also preferably equipped with means (not shown) for rolling the machine so that it can be maneuvered into place next to a piece of processing equipment to which circuit packages must be inputted or from which circuit packages must be outputted. This is most easily accomplished by providing the feet with wheeled casters mounted adjacent their opposite ends.

The height of the machine can be adjusted by turning a height adjusting handle 38 attached to a lead or drive screw (not shown) inside one of the side members of frame 32 thereby effecting the upward movement of the external portions of the telescoping side members. A main air regulator 40 for the compressed air supplied to the machine is mounted on one side member of frame 32. A power cord 42 is provided to connect the machine to a power source.

The primary operative elements of machine 30 are partially enclosed in a cabinet 44 having flat, rectangular side panels 46 and 48 mounted opposite one another on the opposite side members of frame 32. Side panels 46 and 48 have inwardly extending skirts 50 and 52, respectively, mounted about three sides of their periphery. A back panel 54 extends between and is attached to skirts 50 and 52 along their middle portion. An indicator beacon 56 is mounted on a pole 58 attached to and extending upward from the top portion of skirt 50. This indicator beacon is used to send signals to a distant operator regarding the status of the machine. A control panel 60 is mounted alongside side panel 46. An operator can control the functioning of the machine using this control panel. The other elements of the machine shown in FIG. 4 will be described in detail in connection with the description of the elements of machine 30 shown in detail in FIGS. 5–16.

After the machine is started and initialized, the operator will place a group of tubes 14 in a bin or bulk hopper 62 in machine 30. The bulk hopper is defined by a vertical front wall or panel 64, a pair of vertical, internal side walls or panels 66 and 68 that are positioned orthogonal to and at opposite ends of front panel 64, and a slanted back wall or panel 70 that angles downward toward front panel 64 meeting it at its bottom edge. The angle of the back panel cause tubes placed in the bulk hopper to move toward the front panel as they move downward. A pair of tube shuffle arms 72, pivotally attached adjacent opposite ends of the bottom of back panel 70 and normally resting in recessed grooves 74 extending up along opposite ends of the back panel, can also be activated so as to pivot upward away from the top of back panel 70 providing additional means for moving tubes to a substantially known lateral position, i.e., aligned against front panel 64. The shuffle arms are moved by a pair of air cylinders (not shown) mounted under back panel 70. When compressed air is delivered to these air cylinders a pair of pistons (not shown), received in the air cylinders and attached to the shuffle arms via the remote ends of a pair of piston rods (not shown) extending out of the air cylinders from the pistons, are moved outward. As shown in FIG. 5, the tubes placed in the bulk hopper will assume random rotational orientations.

The width of bulk hopper 62 is adjustable to accommodate tubes ranging from 19.75 to 24.00 inches in length. The adjustment is made by turning a hand crank (not shown) attached to a lead or drive screw (not shown). The drive screw acts to move a follower side 76 of machine 30. This follower side has mounted to it the operative mechanisms of machine 30 that must be adjusted to account for varying tube lengths. Therefore, adjusting the width of the bulk hopper is the single adjustment that must be made to prepare the machine for handling tubes of a given length or to switch over to tubes of another given length. The follower side is moved relative to a driver side 78 that remains fixed. The separation between the two sides occurs at slits 80 and 82 extending up and down the lengths of front panel 64 and back panel 70. The follower side, then, can be moved back under skirt 50 to the desired width. An operator sets the width of the hopper to the length of the tubes plus approximately 0.1 inch and then fills the hopper with tubes.

Next, the machine must retrieve a single tube from the number of tubes placed in the bulk hopper. This is accomplished through a pair of opposed gripping fingers 84 and 86, which can be extended into the bulk hopper from opposite sides through openings 88 and 90 that extend along the front edges of side panels 66 and 68 next to front panel 64. The gripping fingers, then, are able to move up and down opposite one another along opposite ends of vertical front panel 64. Each gripping finger has an inward extension 92 that will make contact with a longitudinal face of a tube as the fingers are moved downward into the bulk hopper and an inward facing face 94 below the extension that will grip the end of a tube when the fingers are moved inward into the bulk hopper (FIG. 6). Each gripping finger also has a prong 96 extending vertically upward from the top of extension 92 to prevent tubes from rolling on top of the gripping fingers and being carried up along with the gripped tube.

Figure 7:
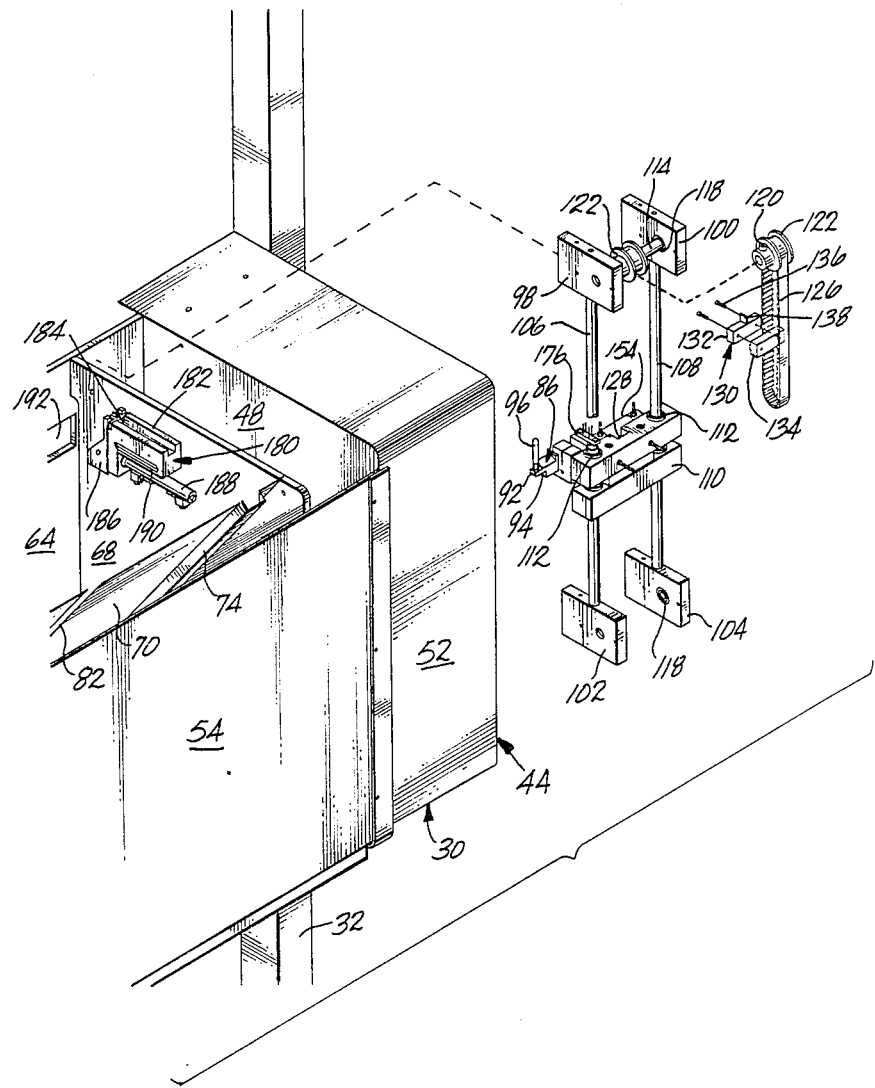
FIG. 7 is a detailed pictorial view of one of the gripping fingers of FIG. 6 and its operative mechanisms.

The operative mechanisms for gripping finger 86 are shown in FIG. 7. The gripping finger and its operative mechanisms are mounted in one side of cabinet 44 between panels 48 and 68 by four corner supports 98, 100, 102 and 104. A pair of vertical, cylindrical rods 106 and 108 extend between and are fixedly attached to pairs of these corner supports so that they are positioned parallel to one another and to panels 48 and 68. Slidably supported between these two rods is a gripping finger carriage 110. The carriage is mounted on these rods by linear bearings 112 so that the carriage can slide or float freely, i.e., substantially without friction, up and down along the lengths of the rods. Horizontal cylindrical rods 114 and 116 extend between upper and lower pairs of the corner supports (the lower rod 116 is not shown). Rods 114 and 116 are rotatably attached by bearings 118 so that they can rotate about their longitudinal axes.

Fixedly attached by set screws 120 to the center of rods 114 and 116 are pulley wheels 122 and 124 (the lower wheel 124 is not shown). A flexible timing belt 126 extends around each of the pulley wheels. One side of the belt passes down through an indentation 128 on one side of carriage 110. Attached to the belt at one point along the length of the belt is a carriage support 130. Support 130 is comprised of two elongated members 132 and 134 which rest on opposite surfaces of the belt. These members extend beyond the width of the belt and are attached to one another by screws 136 threaded through opposite ends of the members on either side of belt 126. Carriage 110 rests on top of support 130. A flag 138 extends upward vertically from the center of the top surface of member 132. When carriage 110 is resting on support 130, this flag blocks a break beam sensor 140 (FIG. 8A) mounted by a pair of screws 142 to the underside of carriage 110.

Rod 116 is driven by a stepping motor (not shown). This stepping motor rotates rod 116 thereby moving belt 126 and support 130 attached to belt 126. As support 130 is moved up or down, carriage 110 will in turn slide up or down on rods 106 and 108. In moving a gripping finger into position to grip a tube, support 130 is moved downward until extension 92 comes in contact with a tube and prevents carriage 110 from sliding downward any further. When this happens, support 130 will continue to move downward until flag 138 is removed from sensor 140. When sensor 140 is unblocked, a signal is sent to the stepping motor to stop downward movement of support 130.

If the distance between the top and bottom of the hopper is large, i.e., greater than about 2 feet, belt drive of carriage 110 is no longer practical because timing belts long enough to handle this distance are not readily available. In this case, the stepping motor can drive a lead screw that will act to slide carriage 110 up or down on rods 106 and 108. This alternative can also be used when the hopper is positioned lower on the machine for easier operator access and the gripping fingers must, therefore, lift the tube further to reach the point where the tube is deflected into a tube orientation area.

The stepping motor is driven by pulses sent by a microprocessor (not shown). The microprocessor stores the distance from the top of the hopper to the point where contact is made with a tube on each try to grip a tube. This allows the gripping fingers to be lowered at a high rate of speed until ramping down to a lower rate of speed just before contact with a tube is expected. This is an important feature as speed of operation is critical to the success of an automatic tube handling system. On the initial try to pick up a tube and just before contact with a tube is expected based on the previous try the fingers are lowered slowly to prevent undue tube agitation. It is possible that the fingers will occasionally contact the tubes at a high rate of speed, such as when new tubes are loaded in the hopper or when tubes in the hopper. shift toward the front panel between tries, but this should not damage the tubes or any circuit packages therein because the fingers are sliding downward with gravity and are not being driven positively downward.

The microprocessor also knows the total number of steps required to traverse from the top to the bottom of the hopper. When a tube is picked up at a point near the bottom of the hopper, the indicator beacon is activated to flash the appropriate signal to the operator to indicate that the hopper is low on tubes. The indicator beacon is used because it is anticipated that one operator will be supervising the operation of a number of automatic tube handling machines from a centralized work station. The indicator beacon, therefore, will convey to this operator the status of the machine at a glance and over some distance.

Figure 8:
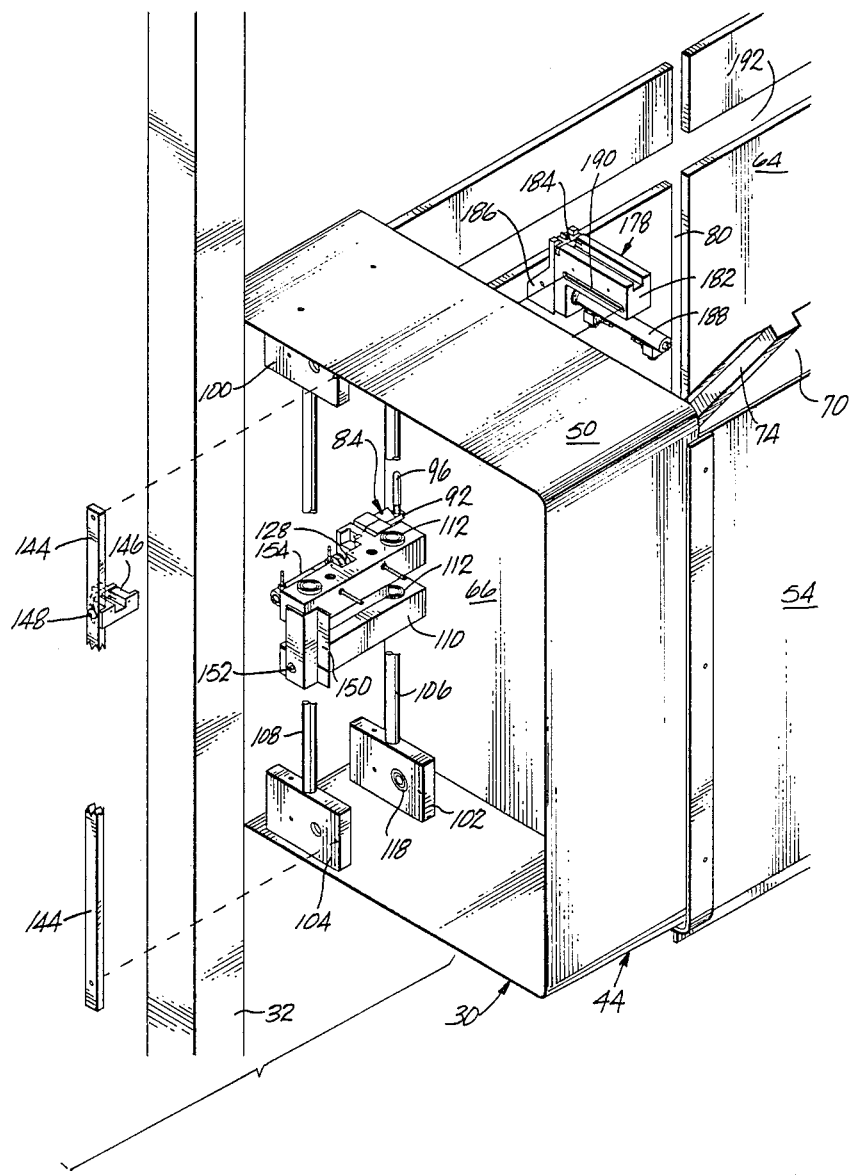
FIG. 8 is a detailed pictorial view of the other gripping finger of FIG. 6 and some of its operative mechanisms.

The operative mechanisms for gripping finger 84 are shown in FIG. 8. Most elements of these operative mechanisms are the mirror image of those present in the operative mechanisms for gripping finger 86. Therefore, not all of the elements are shown and those that are shown that are mirror images are identified by the same numbers used with gripping finger 86. Only those elements unique to gripping finger 84 have been assigned new numbers and will be described in detail below.

For the most part, gripping finger 84 acts in concert with gripping finger 86. Their carriages are moved so that the fingers remain opposite one another during gripping tries. However, gripping finger 84 and its operative mechanisms are mounted on follower side 76 and are moved with that side for adjustments in width. A vertical, rectangular rod 144 also extends between and is fixedly attached to corner supports 100 and 104 associated with gripping finger 84. A break beam sensor 146 is attached by a screw 148 near the upper end of rod 144. This break beam sensor is positioned so that it will be blocked by a flag 150 attached by a screw 152 to the side of carriage 110 when the carriage is at the top of the hopper. When the gripping fingers have retrieved a tube and are moving upward, the blocking of sensor 146 will signal the microprocessor that the tube has been brought to the top and is ready to be deflected into an area where tube orientation takes place.

Figure 8A:
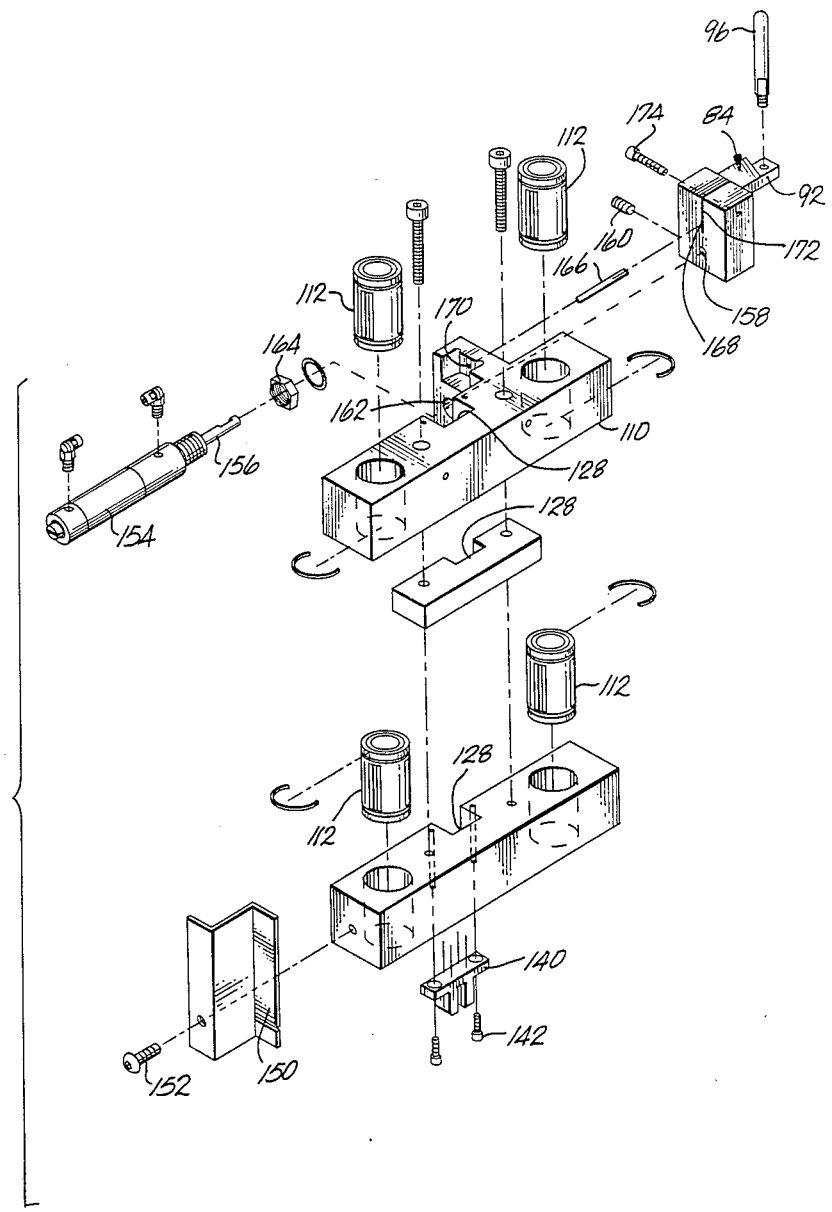
FIG. 8A is an exploded pictorial view of the gripping finger of FIG. 8 and some of its operative mechanisms.

When the gripping fingers are being lowered into the hopper for retrieving a tube, inward facing faces 94 are positioned flush with or slightly behind the inward facing surfaces of panels 66 and 68. Sensor 140 becomes unblocked when extensions 92 have contacted a tube. This signals the microprocessor to stop the movement of belts 126 and it signals the microprocessor that an attempt to grip a tube can be initiated. The gripping fingers are then moved inward by delivering compressed air to the appropriate side of pistons (not shown) received in double acting air cylinders 154. Piston rods 156 extend inwardly from the pistons out of the air cylinders and their remote ends are received in bores 158 on the gripping fingers and held in place by set screws 160 (FIG. 8A). Air cylinders 154 are mounted on carriages 110 by being threaded into bores 162 and are held in place by bolts 164.

The force supplied by air cylinders 154 move the gripping fingers inward to grip a tube. If the opposing fingers have gripped the same tube, the fingers combined will move inward a total of approximately 0.1 inch, that is, the distance by which the width of the hopper exceeds the length of the tubes. If the opposing fingers are acting on different tubes, the fingers combined will move inward a total of approximately 0.2 inch, that is, twice the distance by which the width of the hopper exceeds the length of the tubes because both tubes will be held against the opposite walls of the hopper. This difference in inward movement provides a way to distinguish between the two situations.

Rods 166 are received into bores 168 in the back faces of the gripping fingers and extend outward through bores 170 in carriages 110. Bores 170 have a diameter larger than the diameter of rods 166 so that the rods can move freely in bores 170. Vertical slits 172 extend down partially through the back portions of the gripping fingers and bisect bores 168. Screws 174 are threaded through the back portions of the gripping fingers above bores 168 and orthogonal to slits 172 and provide a means for tightening rods 166 into place. The remote ends of rods 166 extend through break beam sensors 176 (FIG. 7) when the gripping fingers are retracted. As the gripping fingers extend out into the hopper, rods 166 also move relative to break beam sensors 176, which are mounted on carriages 110. The length of rods 166 is set so that when the gripping fingers extend inward only a total of 0.1 inch, sensors 176 are not unblocked. If the gripping fingers extend inward more than this, however, sensors 176 will be unblocked and this will signal the microprocessor that the gripping fingers should be retracted and another attempt made to grip a tube.

The gripping fingers are retracted by delivering compressed air to the appropriate face of the pistons in air cylinders 154. After retraction, the fingers will again be extended into the hopper in an attempt to grip a tube. If after three attempts, the fingers have not been able to grip a single tube, tube shuffle arms 72 will be activated. If after a number of cycles of attempts and shuffles the fingers have not been able to grip a single tube, the microprocessor will activate the indicator beacon to flash an appropriate signal to the operator. Once a single tube has been successfully gripped, the fingers will carry it to the top of the hopper. If a tube falls from the fingers after they have begun to move upward, the gripping pressure on the fingers will move them inward, unblocking sensors 176 and alerting the microprocessor that the fingers must be lowered again in an attempt to grip a tube.

When a tube is successfully brought to the top of the hopper, sensor 146 will be blocked by flag 150. This signals the microprocessor to activate a pair of tube diverters 178 and 180 mounted on panels 66 and 68, which also act as double tube eliminators, and to retract the fingers and release the tube. Each of the tube diverters has a mounting bracket 182 that is secured to the side panel, a rear plate 184 that is slidably received in the mounting bracket and a front shovel 186 mounted on the end of a piston rod (not shown) extending out from a piston (not shown) received in a gas cylinder 188 mounted on the mounting bracket (FIGS. 7 and 8). Front shovel 186 has a vertical upper portion and an angled lower portion that extends outward away from the front of the mounting bracket.

This lower portion of the front shovel acts as a double tube eliminator when the tube diverter is in a retracted position. It is possible that the gripping fingers have gripped the opposite ends of more than one tube. However, when these multiple tubes are being brought upward, the lower portion of the shovel is positioned so that only one tube can pass between it and front panel 64. To account for the varying tube widths needed for storage of circuit packages from 0.300 to 0.600 inch, the retracted position of the front shovel can be adjusted by positioning the rear plate inside the mounting bracket and securing it in place with set screws (not shown) threaded through a slot 190 in the side of the mounting bracket. On retraction, the back surface of the top portion of the front shovel will stop the retraction of the shovel upon contact with the rear plate at the desired position.

Activation of air cylinder 188 extends the front shovel outward so that a released tube brought to the top of the hopper will be deflected through a window 192 into an area where tube orientation is accomplished. After deflection into an orientation cradle (not shown), a pair of opposed centering cones 194 and 196 are moved inward toward opposite ends of the tube. The tube is centered in each cone because of inwardly tapering surfaces on the opposing faces 198 and 200 of the cones (FIG. 9). Cone 196 and its operative mechanisms are mounted on the follower side and cone 194 and its operative mechanisms are mounted on the driver side.

Figure 10:
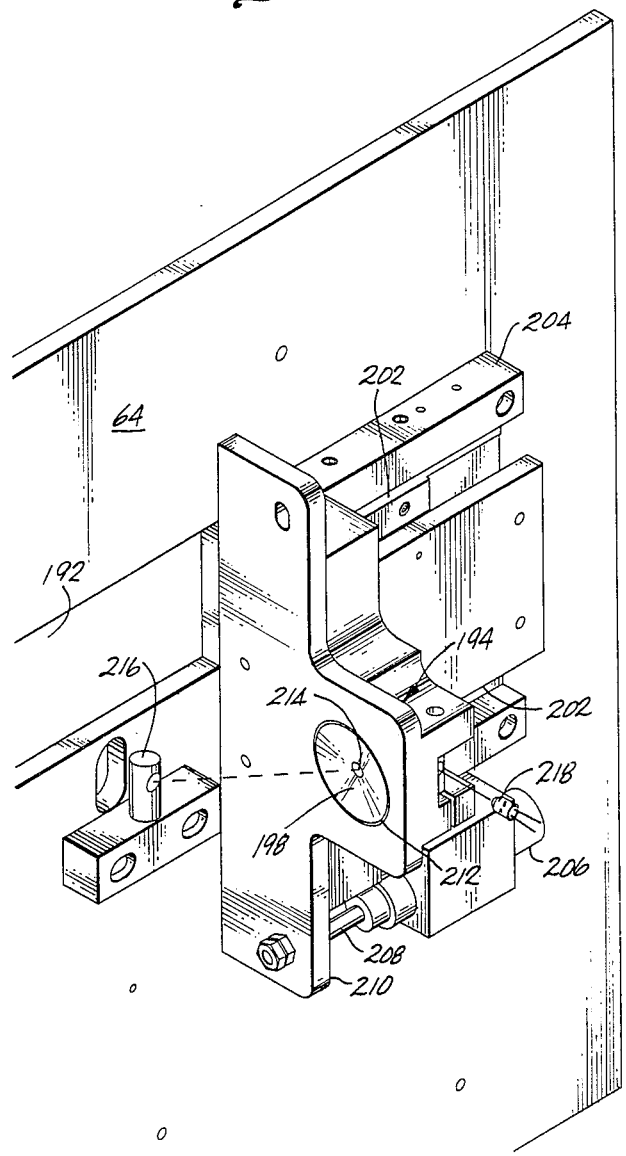
FIG. 10 is a detailed pictorial view of one end of the means for of rotating FIG. 9.

Cone 194 is slidably mounted on the surface of front panel 64 opposite the hopper. It is mounted on a pair of linear bearings 202 in a mounting bracket 204 that allow it to be slid back and forth with respect to a tube end (FIG. 10). Extension toward the tube end and retraction away from the tube end are accomplished by delivering compressed air to the appropriate side of a piston (not shown) received in an air cylinder 206. A piston rod 208 extending from the piston out of the air cylinder is secured at its remote end to a housing 210 for cone 194. Housing 210 also contains a roller bearing 212 that allows the face of cone 194 to rotate freely about the longitudinal axis of a tube it has centered.

The center of face 198 has an opening 214 through which a beam is directed by an emitter 216. The beam is directed into this opening from a 45° angle to the central axis of the cone (FIG. 9). This beam can be detected by a photo darlington orient sensor 218 mounted on housing 210 behind the opening in face 198. When an "A"-frame storage tube is centered by cone 194, the beam will be blocked by the tube except when the indentation separating the legs of the "A"-frame is rotated past.

Figure 10A:
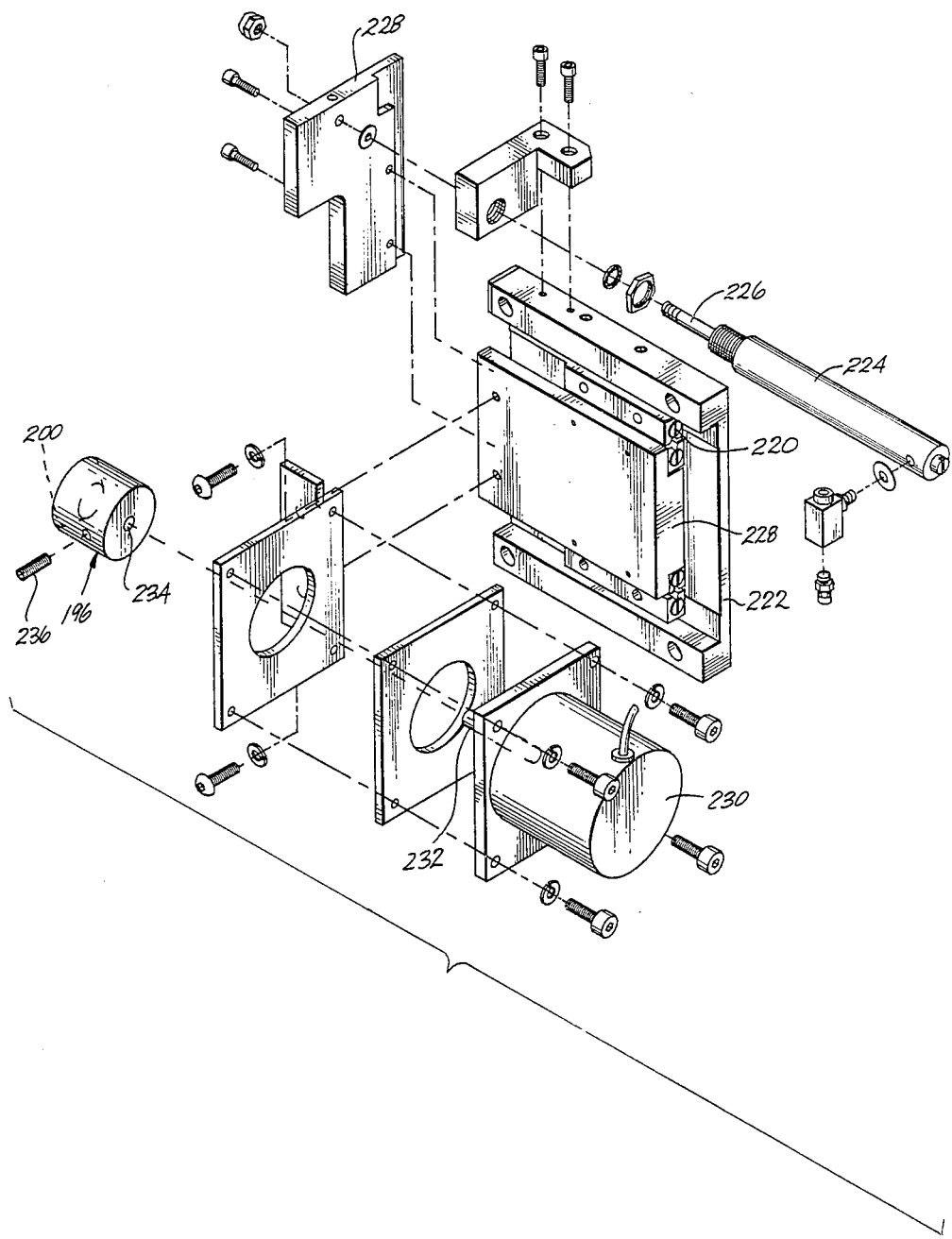
FIG. 10A is an exploded pictorial view of the other end of the means for rotating of FIG. 9.

Rotation of a centered tube is accomplished by cone 196, which is also slidably mounted on the surface of front panel 64 opposite the hopper but at the end opposite cone 194. Cone 196 is mounted on a pair of linear bearings 220 in mounting bracket 222 that allow it to be slid back and forth with respect to a tube end (FIG. 10A). Extension and retraction are accomplished by delivering compressed air to the appropriate side of a piston (not shown) received in an air cylinder 224. A piston rod 226 extending from the piston out of the air cylinder is secured at its remote end to a housing 228 for cone 196. Also mounted on housing 228 behind cone 196 is a stepping motor 230. Stepping motor 230 turns a shaft 232 in response to pulses sent by the microprocessor. The remote end of shaft 232 is received into a bore 234 in the back surface of cone 196 and locked in place by a set screw 236. Face 200 can be provided with indentations or a roughened surface to prevent a centered tube from slipping when cone 196 is rotated by stepping motor 230.

The stepping motor will require a certain number of steps to complete one 360° rotation of a tube. In the preferred embodiment, the number of steps is 200. To orient a tube, the microprocessor counts the number of pulses or steps during which sensor 218 detects an unblocked beam. Dividing this number of steps by 2 provides the microprocessor with the center of the indentation or slot in the "A"-frame tube and the point where the tube was held on its side. A one quarter turn or 50 steps from this point will result in orienting the tube in the live bug or dead bug position depending on the direction of rotation about the longitudinal axis of the tube. Therefore, the microprocessor can use this reference point to orient the tube in the desired position. The microprocessor is programmed to ignore or filter out brief unblocked beam signals, which may be caused by deflection of the beam through the tube. In addition, this approach to orientation will work regardless of the width of the indentation or slot, which will vary depending on whether 0.300 inch, 0.400 inch or 0.600 inch circuit packages are stored therein. Therefore, no adjustment need be made to this procedure when changing tube widths.

The next key process involved in automatic tube handling, after orientation, is pin pulling. In the abstract, this process involves positioning an oriented tube with respect to a gripper assembly 238 such that the head of the stop pin at one end of the tube is between a pair of opposed gripper jaws 240 (FIG. 11A). One end of each jaw 240 is pivotally attached to assembly 238 by a pin 242 extending through that end. The opposite end of each jaw has a tip 244 configured for sliding under one edge of the head of a stop pin. A coil spring 246 extends between the gripper jaws adjacent the end where they are pivotally attached, is received and held in place by notches 248 in each gripper jaw and acts to hold the tips of the two gripper jaws in a normally spaced apart relationship where the tips will be on opposite sides of a stop pin. An external housing 250 has opposed, flat, rectangular plates 252 that extend down around opposite sides of the gripping jaws orthogonal to the pivot axes of the jaws. A pair of rollers 254 extend between and are rotatably attached to the plates. The rollers are positioned so that they are on opposite sides of the gripper jaws parallel to the pivot axes of the jaws.

Housing 250 is then moved relative to the gripping jaws so that rollers 254 roll down the back surface of each jaw and pivot the jaw tips toward one another against the force of spring 246 (FIG. 11B). The jaws are held in place vertically by a hammer 256. This movement slides the jaw tips under the opposite edges of the head of a stop pin. The tips slide under the head of the pin from opposite directions at the same time so that the stop pin tends to be pulled away from the top surface of the tube at a right angle. This prevents excessive deformation of the tube end. The tips stop movement toward one another when they are still spaced apart by a distance approximately equal to the diameter of the shaft of the pin. This prevents damage to the pin.

The entire gripper assembly is then moved away from the tube so that the stop pin is pulled (FIG. 11C). After the tube is emptied or filled, the stop pin will have to be replaced by reversing the steps just discussed in connection with pulling the pin. In other words, gripper assembly 238 will move toward the tube to replace the pin and housing 250 will then be rolled away to release the head of the pin. Therefore, it is very important that the gripper assembly maintain its reference point for hole 16 on the top surface of the tube. This reference point is maintained by controlling the distance which the gripper assembly moves in pulling the pin so that the tip of the pin remains within the confines of hole 16 (FIG. 11C). While the pin should remain within the confines of this hole, its tip should not extend too far into the tube or circuit packages will not be able to flow freely into or out of the end of the tube. This pin pulling distance must be adjusted by the operator prior to handling of a batch of tubes.

Figure 14:
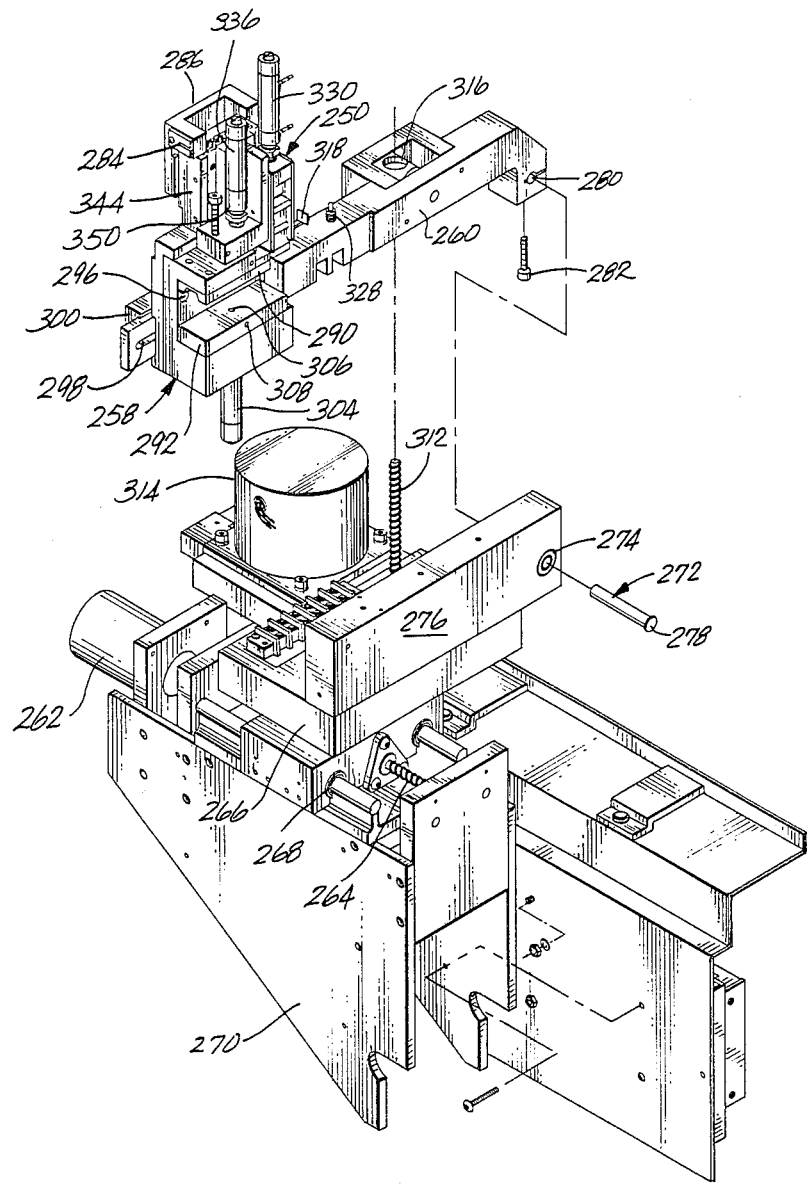
FIG. 14 is a pictorial view of the stop pin pulling means of FIG. 11A and operative mechanisms allowing a storage tube to be aligned with an input or output track for integrated circuit packages.

A tube gripper and pin pulling head 258 is shown in FIG. 12 in which the tube will be gripped in the live bug orientation and extend back and to the right as head 258 is oriented in FIG. 12. After the tube is gripped, its closest end will be pivoted upward in an arc along with head 258 by a pivot arm 260 (FIG. 13) and the pin pulled. Circuit packages can then be fed by gravity into the tube as outputted from a piece of process equipment. To handle a situation where circuit packages are to be delivered in the dead bug orientation, head 258 would merely need to be mounted on pivot arm 260 so that it is rotated 180° from its orientation in FIG. 12 and approaches the tube to be gripped from the opposite lateral direction. For a situation where the circuit packages are to be fed out of the tube and inputted to a piece of process equipment, head 258 is mounted on the pivot arm with the gripper assembly for pin pulling on the end of head 258 facing the pivot point of pivot arm 260 so that when the tube is pivoted upward in an arc the circuit packages will flow by gravity out of the unstopped tube end. FIGS. 13 and 14 depict head 258 in just such a tube emptying configuration.

After a tube has been oriented, it is held between the cones until pivot arm 260 and head 258 are moved laterally into position for gripping the tube. Lateral drive for the arm and head is provided by a stepping motor 262 driving a lead screw 264 (FIG. 14). Lead screw 264 effects the movement of pivot arm support 266, which is mounted by a pair of bearings 268 on a bracket 270 secured to cabinet 44. Arm 260 is pivotally attached to one end of support 266 at a pin 272 that is horizontally mounted in a bearing 274 that extends through an upright member 276 secured to the top surface of support 266. At one end pin 272 has a flat head 278 that prevents it from sliding through member 276. The other end of pin 272 extends outward from a side surface of member 276 and is received in a bore 280 at one end of arm 260. Pin 272 is held in bore 280 by a set screw 282.

The microprocessor is alerted that head 258 has reached the proper position for tube gripping when a flag (not shown) on support 266 blocks a home position break beam sensor (not shown) mounted on the opposite side of bracket 270 (FIG. 12). When head 258 is properly aligned, the end of a tube should be between a jaw 290 for the top of an "A"-frame tube and a jaw 292 for the bottom of an "A"-frame tube. Jaw 290 is fixedly attached to head 258 by a pair of screws 294. The center of jaw 290 has an indentation extending along its face parallel to the longitudinal axis of the tube to be gripped that will tend to center the tube in the jaws and ensure that the gripper assembly for pin pulling will be centered on the stop pin in the end of the tube. Head 258 will approach the tube end facing toward the driver side of machine 30 also, so that its position with respect to the length of the tube need not be adjusted whenever tubes of a different length are to be handled. However, head 258 is mounted on pivot arm 260 by a pair of screws 296 that extend through a slot 298 in pivot arm 260 and thread into a back plate 300 so that head 258 can be tightened into place (FIG. 13). Slot 298 has enough play to allow head 258 to be adjusted with respect to the length of a tube to account for variances in stop pin placement along the length of a tube. The length of the tips of gripper jaws 240 for pin pulling should handle most small variances but some tubes have multiple pairs of holes where stop pins can be placed, each spaced a different distance from the end of the tube depending on the number of circuit packages in the tube. Adjustment of head 258 will handle these variances.

Jaw 292 is the jaw that is moved upward to clamp the tube against jaw 290. The face of jaw 292 should be relatively flat to allow for sliding of the tube as it is aligned by jaw 290 but it can have a narrow ridge 302 (FIG. 13) running longitudinally along its center to catch in an "A"-frame tube's slot and prevent the tube from sliding out of the jaws. When the home position sensor is blocked, the microprocessor will, after a set period of time, activate jaw 292 to clamp the tube and then retract cones 194 and 196. Jaw 292 is activated by delivering compressed air to the appropriate side of a piston (not shown) received in air cylinder 304. A piston rod 306 extends from the piston out of air cylinder 304 and is received at its remote end into a bore 306 in jaw 292. The piston rod is held in place in bore 306 by a set screw 308.

Figure 15:
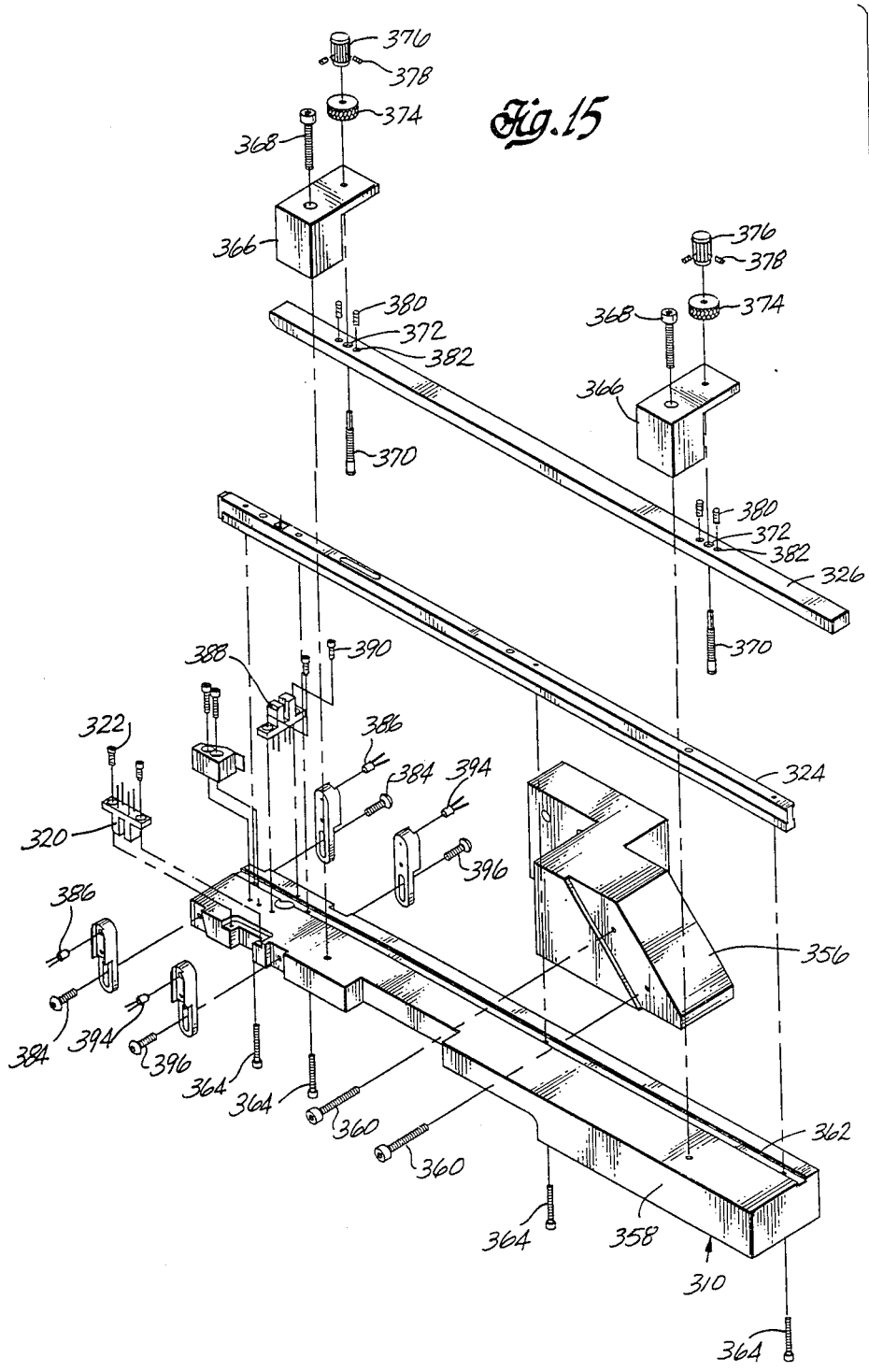
FIG. 15 is an exploded pictorial view of an output track for integrated circuit packages that is part of the machine of FIG. 4.

After the tube is clamped in place between jaw 290 and jaw 292, the pin pulling process described earlier can be carried out. First, however, stepping motor 262 moves support 266 horizontally away from the orienting mechanisms until pivot arm 260 is vertically aligned with a track for feeding circuit packages into the tube or receiving circuit packages from inside the tube to input to a piece of processing equipment. Then, the tube is pivoted upward in an arc by pivot arm 260 so that its end is aligned with this track. FIG. 14 depicts an arrangement where the tube will be pivoted upward so that circuit packages can be emptied out of it. FIG. 15 depicts an input track 310 capable of receiving the circuit packages from inside the tube and inputting them to a piece of processing equipment.

The tube is pivoted upward through the action of a lead screw 312 driven by a stepping motor 314 mounted on support 266 (FIG. 14). Lead screw 312 extends upward from the top surface of support 266 and is received in a socket 316 rotatably mounted on arm 260. Arm 260 is pivoted upward to align the end of the tube with track 310. Proper alignment is determined by a flag 318, mounted on and extending upward from the top surface of pivot arm 260, blocking a break beam sensor 320, mounted by a pair of screws 322 on track 310 and extending downward therefrom.

When properly aligned, the cross member of the "A"-frame tube should be slightly above, about 0.005 to 0.010 inch, a circuit package guide rail 324, mounted on track 310 in line with the longitudinal axis of the tube, onto which the circuit packages will flow (FIG. 15). If the circuit packages were to exit the tube in dead bug orientation, track 310 would be inverted and proper alignment would consist of positioning the top surface of the "A"-frame tube slightly above a circuit package retainer rail 326 in line with the longitudinal axis of the tube and mounted on track 310 parallel to guide rail 324 and slightly spaced from it. The top surfaces of the circuit packages would rest upon and slide along retainer rail 326 with their leads on either side of guide rail 324. If the circuit packages are to be fed into the tube from track 310, the track would be sloped the opposite direction and the tube would be properly aligned when slightly below the appropriate rail on track 310.

Proper alignment is fine tuned by using an adjustment screw 328 threaded into the top surface of pivot arm 260 (FIGS. 13 and 14). The top end of this adjustment screw will contact the lower surface of track 310 stopping the upward movement of pivot arm 260 at the desired position. The operator should adjust this adjustment screw before starting automatic operation of the machine to ensure proper alignment is achieved. Stepping motor 314 will drive lead screw 312 a few extra steps after the microprocessor has received the signal indicating sensor 320 is blocked to make sure that adjustment screw 328 is firmly in contact with track 310.

Once the tube is properly positioned relative to track 310, the microprocessor activates the pin pulling process. Housing 250 is moved through the action of an air cylinder 330 fixedly mounted to the housing (FIG. 12). Compressed air is delivered to the appropriate side of a piston (not shown) received in air cylinder 330. A piston rod 332 (FIG. 11A) is attached to and extends out from one side of this piston out of air cylinder 330 and is fixedly attached at its remote end to hammer 256 by a set screw 334. Thus, activation of air cylinder 330 will move housing 250 relative to hammer 256 and effect the opening or closing of gripper jaws 240 for releasing or sliding under the head of a stop pin, respectively.

Entire gripper assembly 238 is moved through the action of an air cylinder 336 fixedly mounted to a portion of the gripper assembly connected to hammer 256 (FIG. 12). This portion of the gripper assembly is mounted on a plate 338 by a pair of screws 340. Plate 338 is in turn slidably mounted by a pair of linear bearings 342 on a bracket 344. This allows plate 338 and the gripper assembly mounted on it to slide toward and away from the top surface of an "A"-frame tube. Bracket 344 is fixedly secured to head 258 by screws 296. Compressed air is delivered to the appropriate side of a piston (not shown) received in air cylinder 336. A piston rod (not shown) is attached to and extends out from one side of this piston out of air cylinder 336 and its remote end is received into bore 346 in head 258 and held in place by a set screw 348. Thus, activation of air cylinder 336 will move the gripper assembly relative to head 258 and a tube gripped by jaws 290 and 292 and effect pin pulling, pin replacing, extension of the gripper jaws prepatory to closing them, and retraction of the gripper jaws after they have released a pin.

The pin pulling movement of the gripper assembly is preferably controlled so that the point on the pin pulled remains within the confines of the hole in the top surface of the tube. This control is effected by a pin pull adjustment screw 350 threaded into the top surface of head 258 (FIG. 12). Screw 350 extends up from the top surface of head 258 through a clearance hole 352 in gripper assembly 238 and terminates in a head 354 that has a diameter greater than that of clearance hole 352. Therefore, when air cylinder 336 is activated, the gripper assembly will move upward until it contacts head 354. An operator should adjust screw 350 so that the distance of upward movement of gripper assembly 238 results in the pin being pulled the appropriate distance before beginning the automatic handling of a set of tubes.

A bracket 356 secures track 310 to cabinet 44 (FIG. 15). A track mounting base 358 is in turn secured to this bracket by a pair of screws 360 so that the base will be aligned parallel with the longitudinal axis of a tube pivoted up to the track. Guide rail 324 is mounted in a slot 362 extending longitudinally down the upper surface of base 358 by four screws 364. Retainer rail 326 is suspended above guide rail 324 by a pair of clamps 366 that are mounted by screws 368 on base 358 to one side of guide rail 324. Retainer rail 326 is suspended on a pair of pins 370 that extend up through clearance holes 372 in the rail, are threaded through the clamps and a pair of adjustment nuts 374 and terminate in knobs 376. Knobs 376 are held in place on pins 370 by pairs of set screws 378. Rail 326 is normally held away from clamps 366 by pairs of springs 380 located on either side of holes 372 and received in notches 382 in the upper surface of the rail. Therefore, the distance of rail 326 from rail 324 can be adjusted. This distance is preferably close enough to prevent circuit packages from popping off of the guide rail and yet a enough to allow circuit packages to slide freely on the guide rail.

Mounted on opposite sides of base 358 by a pair of screws 384 immediately adjacent the end of the base facing the tube is a shear sensor 386. This sensor will detect anything blocking the end of the track. The microprocessor will check this sensor before the tube is moved away from the end of the track. A similar shear sensor would be checked after filling a tube on a track handling output from a piece of process equipment. If this shear sensor is blocked, the microprocessor will assume that something is tuck in the track and it will initiate a shake routine in which stepping motor 314 drives lead screw 312 rapidly in opposite directions for approximately half a second. If the shear sensor remains blocked, the indicator beacon is activated to alert the operator.

For emptying tubes, the number of circuit packages leaving the tube is counted by counting leads along one side of the circuit packages with a break beam sensor 388 mounted on the upper surface of base 358 by a pair of screws 390. An operator will enter data for calculating the number of leads expected into the microprocessor before initiating tube handling. The appropriate number is calculated by multiplying the number of devices per tube by the number of leads per device, dividing this amount by two and then subtracting a number equal to the number of leads on one device divided by four to allow for an occasional missed lead. If this number is reached, the microprocessor assumes that the entire tube is empty. Air cylinder 336 is then activated to replace the stop pin in the end of the tube. Complete replacement of the stop pin is verified by break beam sensors 284 mounted on either side of a bracket 286 secured to head 258 by a screw 288 (FIG. 12), which are unblocked when plate 338 slides downward to a point where the gripper assembly will have fully inserted the pin. After which air cylinder 330 is activated to release the head of the pin and air cylinder 336 activated in the opposite direction to retract gripper jaws 240. Then, stepping motor 262 is activated to move support 266 horizontally until the tube is vertically aligned with the mouth of a chute (not shown) to an output bin (not shown).

Jaw 292 is then retracted to release the tube so that it falls into the chute. To aid in the release of a tube from jaw 290, a spring ejector flap 392 is mounted along the indentation in the face of jaw 290 (FIG. 12).

If the appropriate number of leads is not reached, the microprocessor checks a track empty sensor 394, mounted on either side of base 358, remote from the end of the track adjacent the tube end, by a pair of screws 396, to determine whether or not circuit packages have been backed up along the track awaiting input to a piece of processing equipment. If this sensor is unblocked, then the microprocessor assumes that a device is jammed in the tube and activates stepping motor 314 to perform the shake routine described earlier. If the appropriate number is still not reached after a half second of shaking, the pin is replaced in the tube, the tube is moved horizontally to vertical alignment with a chute (not shown) to a reject bin (not shown) and the tube is released so that it falls into this chute. The tubes in the reject bin will be visually inspected by an operator before they are reloaded. If a large number of tubes are rejected in a row, the microprocessor will activate the indicator beacon to alert an operator of this fact. It may be that the pins are not being properly pulled from the tubes. The operator can then make adjustments to screw 350 to remedy the problem.

For filling a tube with devices, the number of devices is more critical because a tube should not be underfilled and cannot be overfilled. Therefore, rather than use a lead counting system a conventional, stepping-motor-driven, dual-wheel singulation system (not shown) is used. This system is mounted on the end of track 310 remote from the end adjacent the tube and delivers one device at a time until the desired quantity is reached. The filled tube is then deposited in the output bin. If for any reason the correct number of devices cannot be filled in the tube, then the tube is deposited in the reject bin for visual inspection.

Figure 16:
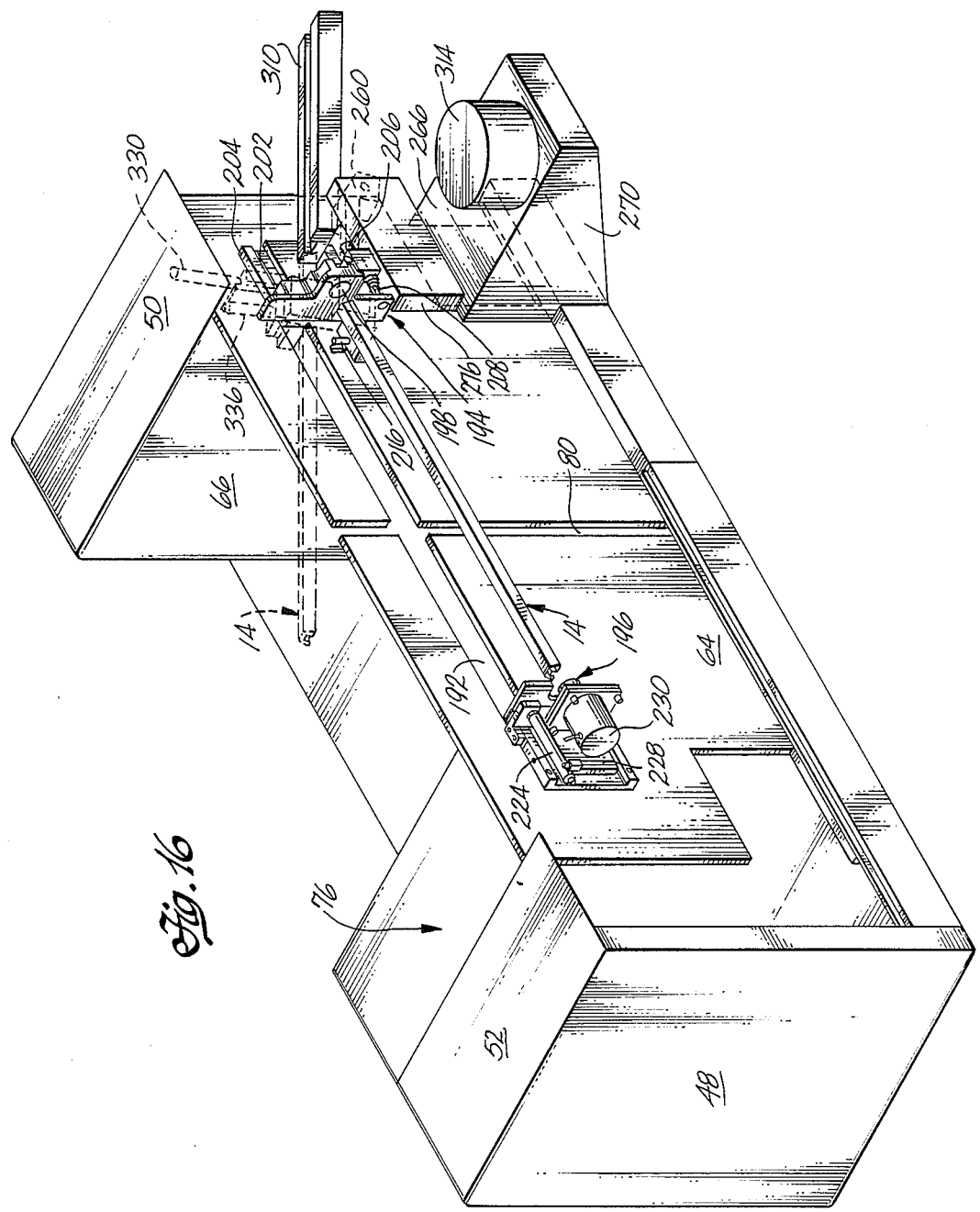
FIG. 16 is a schematic pictorial view of the machine of FIG. 4 from the side opposite the bulk storage hopper.

Thus far, the tube orientation, pin pulling and track alignment steps have been described and depicted in a modular fashion for the sake of clarity. FIG. 16 attempts to pull these steps together by illustrating the relative positions of the mechanisms performing these steps and their interaction with one another. The orientation cones and a tube in position to be centered on these cones are depicted in solid lines. The tube gripping and pin pulling head, the pivot arm and a tube that has been pivoted upward to align with the track for delivering circuit packages out of the tube are depicted in phantom lines, although they would be in the foreground of FIG. 16.

In the preceding description of the preferred embodiment, compressed air lines and electrical wires have been omitted from the drawings for the sake of clarity. Compressed air connections to the various air cylinders and electrical connections to the various stepping motors and sensors have often been shown in the drawings but have not been described in detail. A person skilled in the art would have no trouble developing a compressed air system and an electrical system able to accomplish the activation of air cylinders and stepping motors as required to perform the above described functions. In the preferred embodiment, electronically actuated solenoid valves are used to control the delivery of compressed air to the appropriate sides of the various air cylinders.

Figure 17:
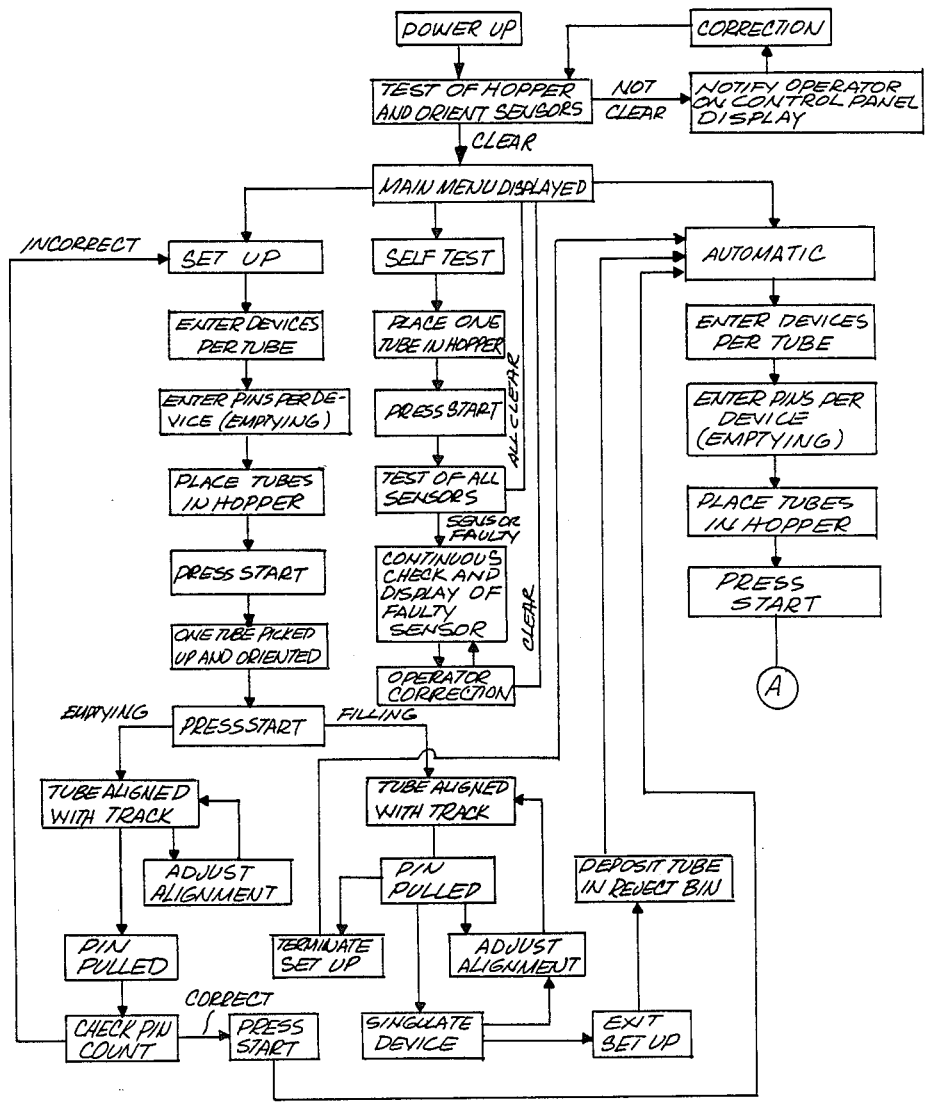
FIG. 17 is part of a flow diagram of the operating routines followed by the machine of FIG. 4.
Figure 17A:
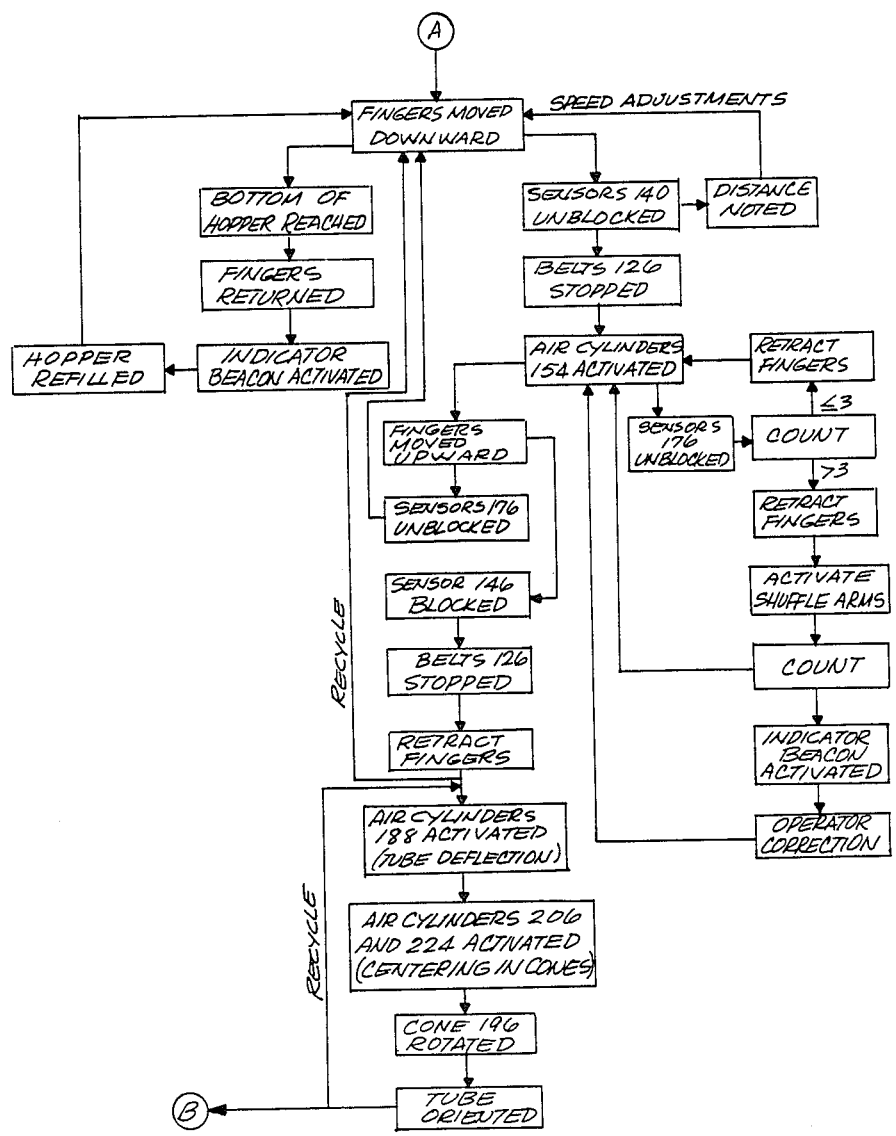
FIG. 17A is a continuation of the flow diagram of FIG. 17.
Figure 17B:
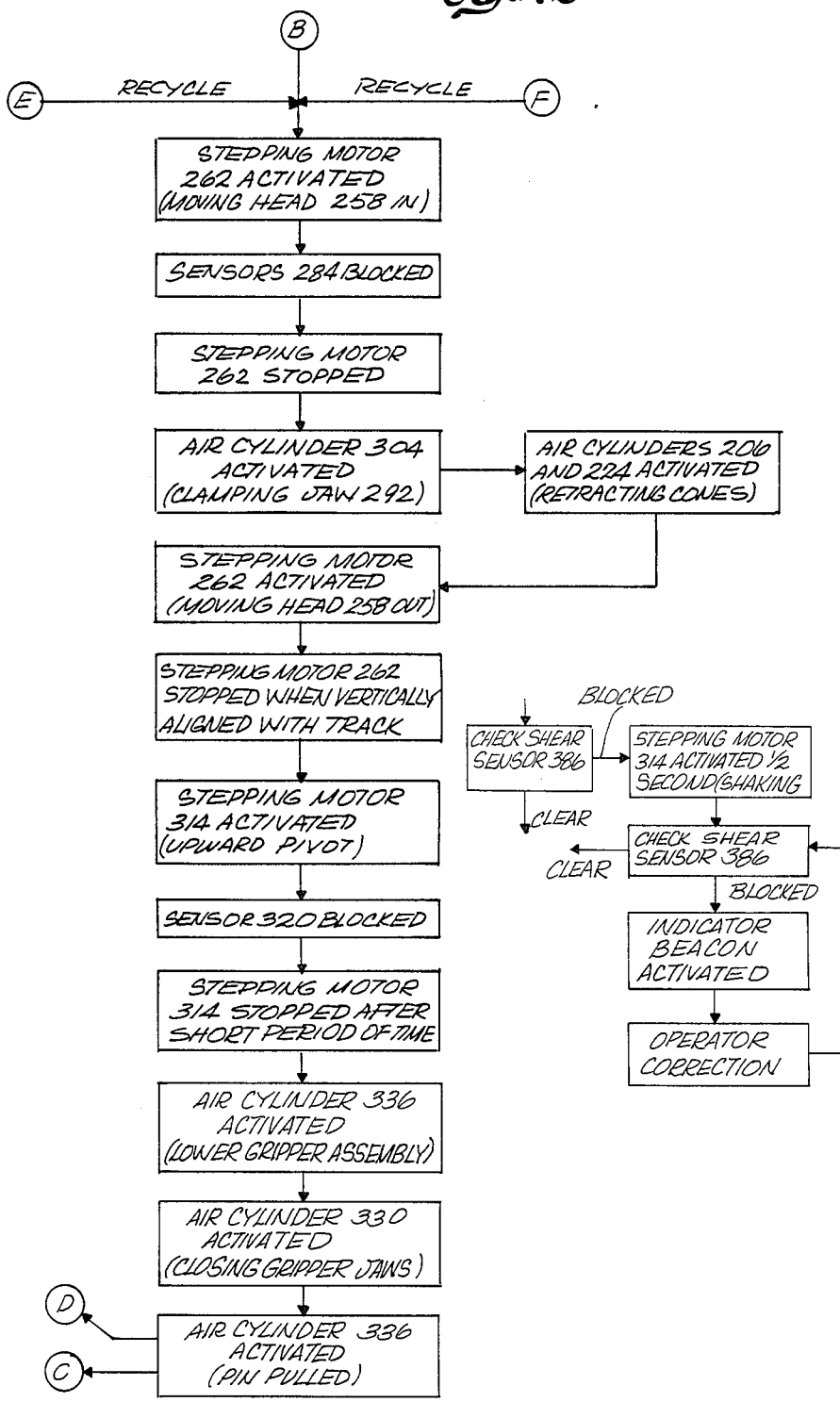
FIG. 17B is a continuation of the flow diagram of FIG. 17A
Figure 170:
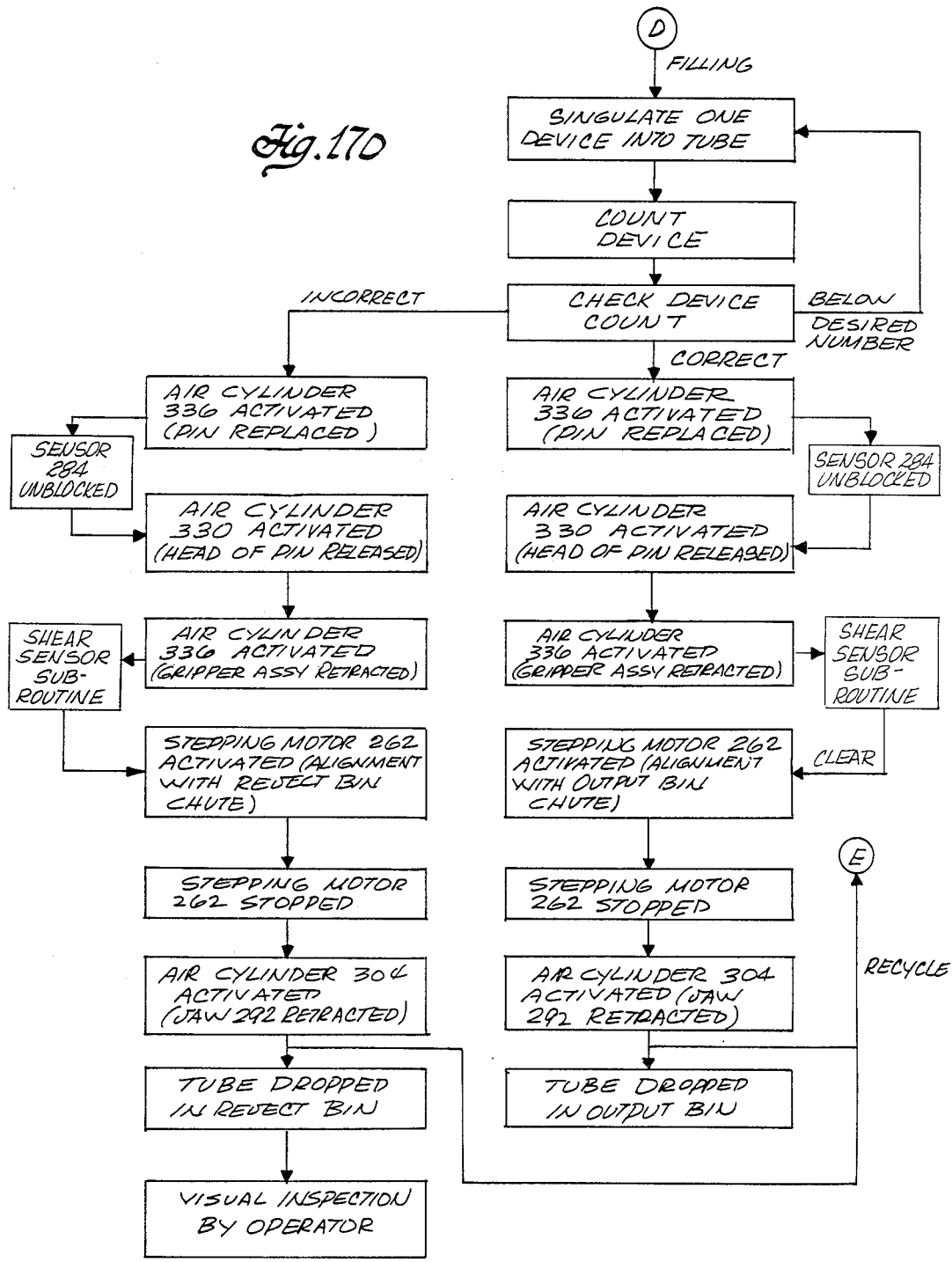

With reference to FIGS. 17 through 17D, a flow diagram is set out for the logical and mechanical steps followed by the machine of the preferred embodiment in automatically handling storage tubes as described above. This flow diagram provides a useful and largely self explanatory summary of the sequence of steps carried out by automatic tube handling machine 30. After the main power switch is turned on, the machine performs a self test of the sensors in the hopper and orientation areas to ensure that no old tubes remain in the machine and that these sensors are functioning properly. If a problem is discovered, this fact is communicated to the operator on the control panel display so that the problem can be corrected. Otherwise, the main menu of program modes is displayed for the operator. The self test mode initiates a check of all solid state break beam sensors in the system for both opens and shorts. When a sensor fails the test, the system locks up in a continuous check and display of the faulty sensor, allowing the operator or a technician to attempt to correct the situation while the system is on. After all the sensors have passed the test, the display returns to the main menu. The set up mode is used to allow the operator to step through the handling of a tube to check or reset the mechanical adjustments required for devices with differing dimensions. The tube alignment subroutine will differ depending on whether the machine is set up to empty or fill the tubes. After the adjustments have been completed, the operator is given the option of proceeding into the automatic mode. In the automatic mode, machine 30 proceeds to carry out with as little operator supervision or intervention as possible the tube handling procedures outlined above. Only rarely should operator correction be necessary and the indicator beacon activated. Visual inspection of rejected tubes will be necessary. The flow diagram also indicates the points where portions of the system recycle to begin handling of another tube.

A person skilled in the art would be able to program a microprocessor or develop an alternative control means for carrying out the steps indicated in the flow diagram.

The preferred embodiment of an automatic storage tube handling machine has been described. The machine is designed to handle "A"-frame storage tubes for circuit packages, but the present invention should not be regarded as being limited to this application alone. Selective retrieval of elongated members having any number of regular or irregular cross sections is possible through application of the teachings of the present invention. In addition, use of a single break beam to locate an indexing means on an elongated member could be used to advantage in orientation of a number of objects according to the present invention. This indexing means can be any unique aspect of the cross sectional outline of the member which can be detected by a break beam sensor.

What is claimed is:

1. A machine for handling elongated storage tubes capable of holding components in a uniform and substantially fixed position with respect to at least one rotational axis of the components within individual tubes, comprising:
a bin for holding the tubes in a substantially known longitudinal position, the bin including means for moving tubes to a substantially known lateral position;
a gripping means comprising a pair of opposed gripping fingers, the gripping fingers being slidably affixed at opposite ends of the bin and being inwardly moveable for grasping the opposite ends of an individual tube;
automated means for lowering the gripping fingers toward the substantially known lateral position until the gripping fingers contact an individual tube in the bin, and for moving the gripping fingers to grasp the ends of the contacted tube and lift it from the bin; and
automated means for rotating the tube, after it has been lifted from the bin, about its longitudinal axis to a desired rotational position determined by reference to an indexing means on the tube related to the position of components held in the tube, whereby components with a substantially known orientation can be fed to and from the tube.

2. A machine as defined in claim 1 wherein each storage tube includes a removable closure for holding components longitudinally within the tube, and further comprising means for releasing the closure, whereby components can be fed longitudinally to and from the tube.

3. A machine as defined in claim 2 wherein the closure releasing means is arranged to maintain the released closure in a substantially known relationship to the tube during feeding of the components.

4. A machine as defined in claim 3 wherein the closure releasing means is arranged to replace the closure after feeding of the components.

5. A machine as defined in claim 1 wherein the gripping fingers each have inward extensions that will make contact with a tube when the gripping fingers are lowered toward the substantially known lateral position, and inward facing faces below the extensions that will grasp the opposite ends of a tube when the fingers are moved inward.

6. A machine as defined in claim 5 wherein the gripping fingers each have prongs extending upward from the top of the extensions to prevent tubes from rolling on top of the gripping fingers and being lifted upward with the contacted tube.

7. A machine as defined in claim 1 wherein the bin has opposing walls for holding the tubes in a substantially known longitudinally position that are spaced from the ends of the tubes a known distance, and further comprising means for determining the distance of inward movement from the opposing walls that the gripping fingers have moved before grasping the end of a tube so that the machine can distinguish between a situation where the gripping fingers are grasping the opposite ends of the same tube and a situation where the gripping fingers are acting on the opposite ends of different tubes.

8. A machine as defined in claim 1 wherein the automated means for rotating the tube is comprised of means for incrementally rotating the tube so that a certain number of steps are required to complete one 360° rotation of the tube, a sensor adapted for detecting a beam from an emitter that is unblocked when the indexing means on the tube is rotated through a particular number of steps, and means for counting the particular number of steps during which the sensor detects the beam so that the tube can be rotated to a desired rotational position by reference to the center of the indexing means.

9. A machine as defined in claim 1 wherein the width of the bin is adjustable to accommodate tubes of various lengths.

10. A machine as defined in claim 1 wherein the gripping means also comprises a pair of slidable supports for the pair of opposed gripping fingers, the slidable supports being driven by stepping motors.

11. A machine as defined in claim 10 wherein the gripping fingers rest on top of the supports and are not driven positively downward when the supports are driven downward by the stepping motors.

12. A machine as defined in claim 10 wherein the automated means for lowering also comprises means for controlling the rate at which the gripping fingers are lowered and means for storing the distance the gripping fingers are lowered before they contact a tube in the bin.

* * * * *